US012808950B2

(12) United States Patent
Van Sickle et al.

(10) Patent No.: US 12,808,950 B2
(45) Date of Patent: Nov. 24, 2026

(54) MONITORING DEGRADATION OF BUSS CABLES

(71) Applicant: Commercial Metals Company, Irving, TX (US)

(72) Inventors: Kyle Van Sickle, San Tan Valley, AZ (US); Keith Zobel, Phoenix, AZ (US); Sammy A. Matson, San Antonio, TX (US)

(73) Assignee: Commercial Metals Company, Irving, TX (US)

( * ) Notice: Subject to any disclaimer, the term of this patent is extended or adjusted under 35 U.S.C. 154(b) by 696 days.

(21) Appl. No.: 18/131,289

(22) Filed: Apr. 5, 2023

(65) Prior Publication Data

US 2023/0324474 A1 Oct. 12, 2023

Related U.S. Application Data

(60) Provisional application No. 63/329,714, filed on Apr. 11, 2022.

(51) Int. Cl.

| | |
|---|---|
| ***G01N 25/72*** | (2006.01) |
| ***G01R 15/18*** | (2006.01) |
| ***G01R 31/58*** | (2020.01) |

(52) U.S. Cl.

CPC ............. *G01R 31/58* (2020.01); *G01N 25/72* (2013.01); *G01R 15/181* (2013.01)

(58) Field of Classification Search

None

See application file for complete search history.

(56) References Cited

U.S. PATENT DOCUMENTS

| | | | |
|---|---|---|---|
| 3,769,440 A | 10/1973 | Goodman | |
| 4,283,678 A | 8/1981 | Halter | |
| 6,940,702 B2 | 9/2005 | Kojovic et al. | |
| 2006/0114963 A1 | 6/2006 | Gerhan et al. | |
| 2007/0207656 A1* | 9/2007 | Miettinen | G01R 31/52 439/274 |
| 2011/0025305 A1* | 2/2011 | Lint | H01F 38/30 324/150 |

FOREIGN PATENT DOCUMENTS

| | | |
|---|---|---|
| CN | 101825655 | 9/2010 |
| CN | 108627738 | 10/2018 |
| DE | 000010201923 A1 | 8/2002 |
| DE | 10 2011 016 966 A1 | 10/2012 |

(Continued)

OTHER PUBLICATIONS

Notification from the Patent Office of the Republic of Poland for the referenced application No. P.444368, mailed on Apr. 5, 2024, 5 pages.

(Continued)

*Primary Examiner* — Erica S Lin

(74) *Attorney, Agent, or Firm* — E. Eric Mills; Nicholas P. Stadnyk; Maynard Nexsen PC

(57) ABSTRACT

A method including measuring, in a buss cable over a plurality of time periods, a voltage, a current, and a temperature. The method also includes determining, using the voltage, the current, and the temperature, a degree to which the buss cable has degraded. The method also includes returning the degree to which the buss cable has degraded.

5 Claims, 15 Drawing Sheets

(56) References Cited

FOREIGN PATENT DOCUMENTS

| | | | |
|---|---|---|---|
| EP | 1026921 | | 1/2008 |
| JP | 2000268647 | A | 9/2000 |
| JP | 2020118481 | | 8/2020 |
| KR | 101450083 | | 10/2014 |

OTHER PUBLICATIONS

Official Action from the Canadian Patent Office for the referenced application No. 3,195,699, mailed on Aug. 27, 2024, 4 pages.

* cited by examiner

MONITORING DEGRADATION OF BUSS CABLES

CROSS-REFERENCE TO RELATED APPLICATIONS

This application claims priority to U.S. provisional patent application No. 63/329,714, filed Apr. 11, 2022, the entirety of which is hereby incorporated by reference.

BACKGROUND

The present disclosure relates in general to buss cables for furnaces for melting metals, such as electric arc furnaces or ladle furnaces, and in particular to monitoring buss cable degradation.

SUMMARY

The one or more embodiments provide for a method. The method includes melting metal in a furnace. Melting includes supplying electrical power to an electrode to create an arc to melt the metal in the furnace. The electrical power is supplied to the electrode via a buss cable. The method also includes measuring a temperature of the buss cable. The method also includes determining, using the temperature of the buss cable, a degree to which the buss cables has degraded.

The one or more embodiments also provide for another method. The method includes measuring, in a buss cable over a plurality of time periods, a voltage, a current, and a temperature. The method also includes determining, using the voltage, the current, and the temperature, a degree to which the buss cable has degraded. The method also includes returning the degree to which the buss cable has degraded.

The one or more embodiments also includes a system. The system includes an electrode and a buss cable in electrical communication with the electrode. The system also includes a temperature measurement system adapted to measure a temperature of the buss cable. The system also includes a controller programmed to receive the temperature and to determine, using the temperature, a degree of degradation of the buss cable.

Other aspects of the invention will be apparent from the following description and the appended claims.

BRIEF DESCRIPTION OF DRAWINGS

Like elements in the various Figures are denoted by like reference numerals for consistency.

DETAILED DESCRIPTION

Figure 1:
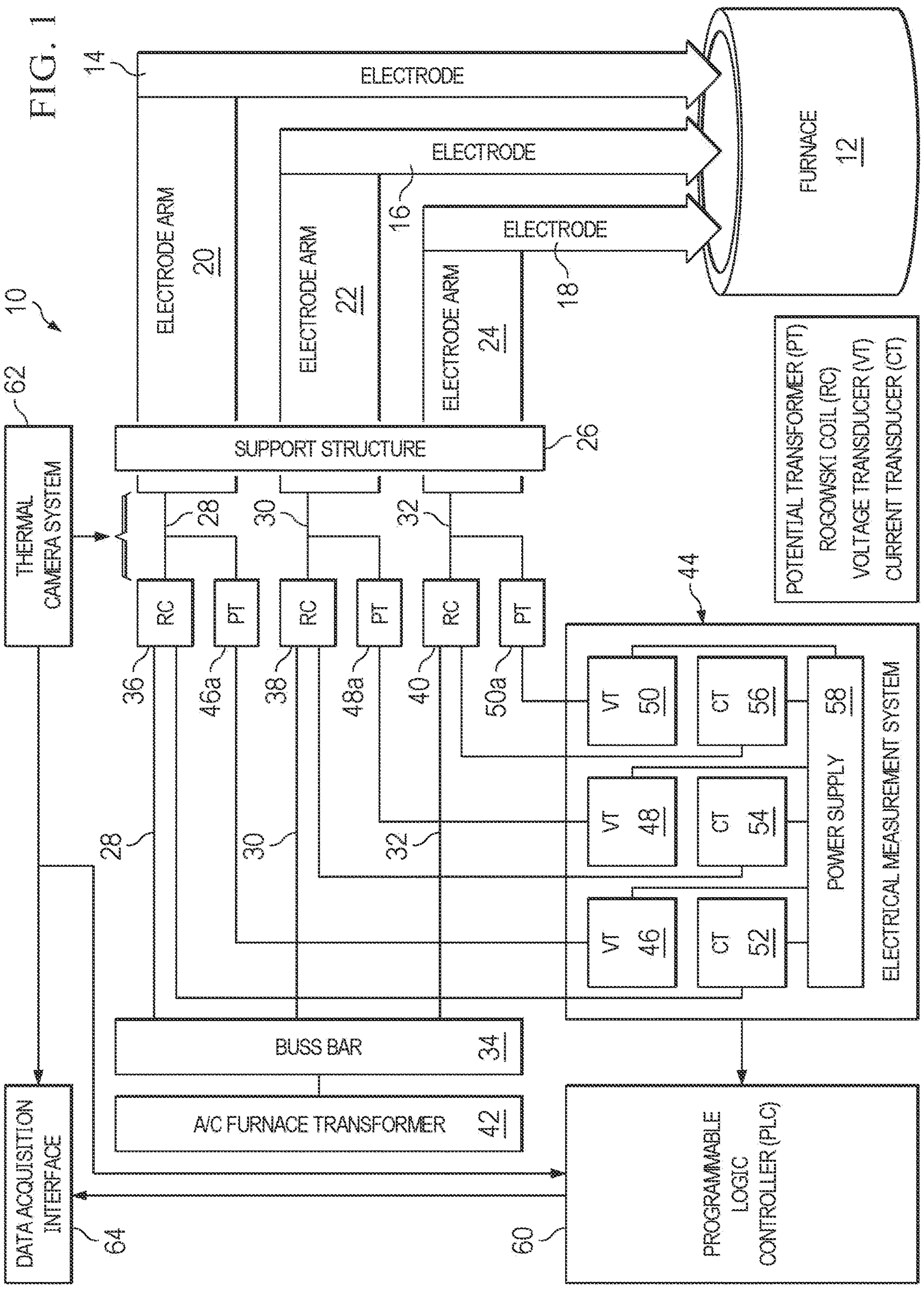
FIG. 1 is a schematic diagram of a buss cable monitoring system, according to one or more embodiments.

In general, embodiments are directed to monitoring buss cables used in industrial applications. The one or more embodiments use a combination of temperature monitoring, infrared camera monitoring, and other sensors to detect a degree of degradation in bus cables. When the buss cables are detected as being sufficiently degraded according to a pre-determined standard, the buss cables may be replaced before a buss cable failure occurs.

It is to be understood that the present disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for simplicity and clarity and does not in itself dictate a relationship between the various embodiments and/or configurations discussed.

Referring to FIG. 1, in an embodiment, a buss cable monitoring system is generally referred to by reference numeral 10 and includes a furnace 12 and electrodes 14, 16, and 18 operably associated therewith. The electrodes 14, 16, and 18 are connected to electrode arms 20, 22 and 24, respectively. A support structure 26 supports the electrode arms 20, 22 and 24. In some embodiments, the furnace 12 is an electric arc furnace. In some embodiments, the furnace 12 is an electric arc furnace and one or more test switch assemblies are installed in the electric arc furnace. In some embodiments, the furnace 12 is a ladle furnace. In some embodiments, the furnace 12 is a ladle furnace and one or more test switch assemblies are installed in the ladle furnace.

Buss cables 28, 30, and 32 extend from the electrodes arm 20, 22, and 24, respectively, and to a buss bar 34. The electrode arms 20, 22, and 24 are in electrical communication with the buss bar 34 via the buss cables, 28, 30, and 32, respectively. In one or more embodiments, each of the buss cables 28, 30, and 32 is a water-cooled buss cable. In some embodiments, the buss cables 28, 30, and 32 are also connected to, and at least in part supported by, the support structure 26.

Rogowski coils 36, 38, and 40 extend around the buss cables 28, 30, and 32, respectively. In some embodiments, an integrator circuit is in electrical communication with each Rogowski coil 36, 38, and 40, or each Rogowski coil 36, 38, and 40 includes an integrator circuit. In some embodiments, a mounting system for each of the Rogowski coils 36, 38, and 40 is built using a thermoset polyester material, such as a rigid fiberglass reinforced composite laminate with a polyester resin (GPO-3), and/or another arc-resistant material. The mounting system includes nylon hardware proximate each of the Rogowski coils 36, 38, and 40. In some embodiments, the mounting system is anchored into a wall and/or other support structure(s) with stainless steel hardware.

An alternating current (AC) furnace transformer 42 is in electrical communication with the buss bar 34, which in turn is in electrical communication with the buss cables 28, 30, and 32. The AC furnace transformer 42 is a three-phase power transformer. The AC Furnace Transformer 42 uses a three-phase electric power configuration, such as a wye or delta configuration.

An electrical measurement system 44 is in electrical communication with each of the Rogowski coil 36, 38, and 40. The electrical measurement system 44 includes voltage transducers 46, 48, and 50, which are in electrical communication with potential transformers 46*a*, 48*a*, and 50*a*, respectively. The potential transformers 46*a*, 48*a*, and 50*a* are in electrical communication with the buss cables 28, 30, and 32, respectively, and are adapted to measure voltage of the buss cables 28, 30, and 32, respectively. The potential transformers 46*a*, 48*a*, and 50*a* are used in systems including alternating current (AC) furnaces, but not direct current (DC) furnaces.

Current transducers 52, 54, and 56 are in electrical communication with the Rogowski coils 36, 38, and 40, respectively. A power supply 58 is configured to supply electrical power to the electrical measurement system 44, including the current transducers 52, 54, and 56 and the voltage transducers 46, 48, and 50. In some embodiments, the power supply 58 is a 24V direct current (DC) power supply. In some embodiments, the electrical measurement system 44 includes multiple power supplies.

A programmable logic controller (PLC) 60 is in electrical communication with the electrical measurement system 44. The PLC 60 is in electrical communication with a thermal camera system 62. The thermal camera system 62 is positioned proximate the buss cables 28, 30, and 32, and is configured to measure temperatures of each of the buss cables 28, 30, and 32. In some embodiments, the thermal camera system 62 includes a plurality of thermal cameras, each of which is associated with a respective one of the buss cables 28, 30, and 32.

A data acquisition interface 64 is in electrical communication with each of the PLC 60 and the thermal camera system 62. In one or more embodiments, the data acquisition interface 64 includes, or enables, a human machine interface such as a graphical user interface. In one or more embodiments, the data acquisition interface 64 includes one or more inputs, one or more outputs, one or more ports, one or more combinations of the foregoing, etc. In some embodiments, the data acquisition interface 64 enables logging, collecting, graphing, or analyzing data, or any combination thereof. In some embodiments, the data acquisition interface 64 is in electrical communication with a computing node, such as a computer.

Figure 2:
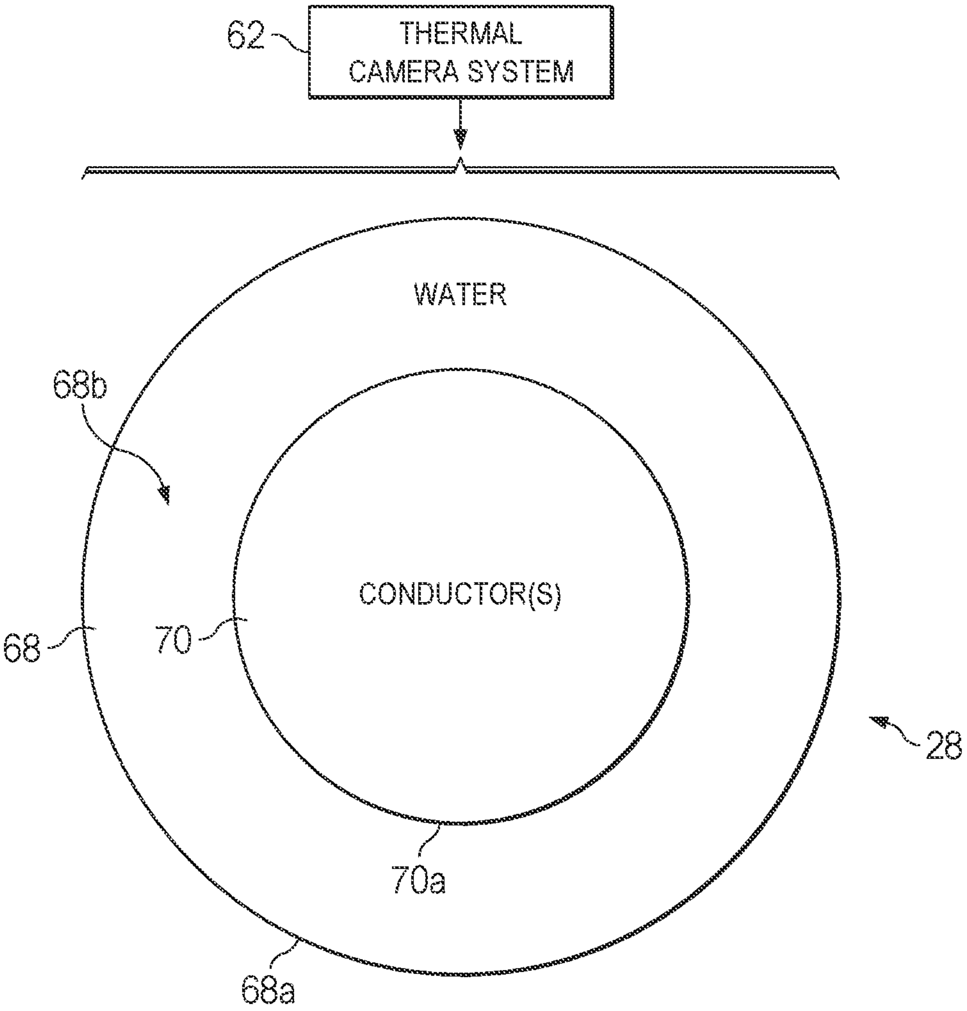
FIG. 2 is a diagrammatic cross-sectional view of a portion of a water-cooled buss cable of the buss cable monitoring system of FIG. 1, according to one or more embodiments.

Referring to FIG. 2 with continuing reference to FIG. 1, the buss cable 28 is a water-cooled cable and includes a water jacket 68. The water jacket 68 includes an outer cable hose/jacket(s) 68*a*, which defines an outer boundary of an annular region 68*b* in which water is disposed. In several embodiments, water is configured to flow through the annular region 68*b*.

Conductor(s) 70 are coaxial with the outer cable jacket(s) 68*a*. The conductor(s) 70 extend through cable shielding, insulation, jacket(s), etc. 70*a*, which is/are coaxial with the conductor(s) 70 and define the inner boundary of the annular region 68*b*. The water disposed in the annular region 68*b* is configured to cool the buss cable 28, including the conductor(s) 70. In some embodiments, instead or, or in addition to, the water jacket 68, the buss cable 28 defines one or more tunnels or passageways for water to be disposed in. In several embodiments, water is configured to flow through these tunnels or passageways. In several embodiments, these tunnels or passageways are spirally wound around the conductor(s) 70. As shown in FIG. 2, the thermal camera system 62 is positioned proximate the buss cable 28.

In several embodiments, each of the buss cables 30 and 32 is a water-cooled cable that is substantially like the embodiment of the buss cable 28 described above and illustrated in FIG. 2. In several embodiments, one or more of the buss cables 28, 30, and 32 is/are different in design and operation from one or more of the other buss cables 28, 30, and 32.

In operation, while adjusting the voltage level, the AC furnace transformer 42 transfers electricity to the buss bar 34, and ultimately to the electrodes 14, 16, and 18 via the buss cables 28, 30, and 32, respectively. The transfer of electricity to the electrodes 14, 16, and 18 creates electric arcs to melt metals in the furnace 12. The electrical power supplied to the electrodes 14, 16, and 18, via the buss cables 28, 30, and 32, respectively, is a three-phase electrical power system. Each of the three electrical phases is associated with a separate one of the electrodes 14, 16, and 18. Accordingly, a first phase is associated with electrical power transferred from the AC furnace transformer 42 to the buss bar 34, the buss cable 28, the electrode arm 20, and the electrode 14. A second phase is associated with electrical power transferred from the AC furnace transformer 42 to the buss bar 34, the buss cable 30, the electrode arm 22, and the electrode 16. A third phase is associated with electrical power transferred from the AC furnace transformer 42 to the buss bar 34, the buss cable 32, the electrode arm 24, and the electrode 18.

During the transfer of electricity via the buss cables 28, 30, and 32, the Rogowski coils 36, 38, and 40 produce output currents associated with the buss cables 28, 30, and 32, respectively. These output currents are used to determine the respective electrical currents in the buss cables 28, 30, and 32. In some embodiments, each of the Rogowski coils 36, 38, and 40 includes an integrator circuit, which is used to provide an output signal that is proportional to the electrical current flowing through the respective buss cable. The potential transformers 46*a*, 48*a*, and 50*a* produce output voltages. These output voltages determine if voltages are present at the buss cables 28, 30, and 32, respectively, and indicate the respective voltage drops across the buss cables 28, 30, and 32.

In some embodiments, the Rogowski coil 36 sends its measured output data and/or signal to the current transducer 52. The Rogowski coil 38 sends its measured output data to the current transducer 54. The Rogowski coil 40 sends its measured output data and/or signal to the current transducer 56.

In some embodiments, the potential transformer 46*a* sends its measured output data and/or signal to the voltage transducer 46. The potential transformer 48*a* sends its measured output data and/or signal to the voltage transducer 48. The potential transformer 50*a* sends its measured output data and/or signal to the voltage transducer 50.

The voltage transducers 46, 48, and 50 and/or the current transducers 52, 54, and 56 convert the output data into electrical signals and/or data that may be read by the PLC 60. The output data and/or signals relate to the measured current flowing through, and/or the measured voltage across, each of the buss cables 28, 30, and 32.

In some embodiments, the Rogowski coils 36, 38, and 40 send output data and/or signals to the current transducers 52, 54, and 56, which determine the amount of electrical current flowing through the buss cables 28, 30, and 32, respectively. The current transducers 52, 54, and 56 send output data and/or signals to the PLC 60.

As described above, the electrical measurement system 44 sends output data and/or signals to the PLC 60, which in some embodiments scales the output data and/or signals. In other embodiments, the PLC 60 receives the measured output data and/or signals, but instead of scaling the output data and/or signals, sends the output data and/or signals to another computer system to be processed and displayed. In some embodiments, the PLC 60 may scale the output data and/or signals using programs such as, but not limited to, IGNITION® by Inductive Automation and/or "iba" by iba AG. In several embodiments, the PLC 60 accommodates and scales the output data and/or signals, i.e., the measured current and/or voltage, received from the electrical measurement system 44. In some embodiments, modification of the logic of the PLC 60 may accommodate and scale the signals associated with the measured current and voltage. In some embodiments, modification of IGNITION® and/or "iba" is useful to add tags and decide on a scan class.

In one or more embodiments, the output data and/or signals are trended over time to predict and/or determine degradation of the buss cables 28, 30, and 32. The term "trended" means that data is collected over time and trends in the data are measured directly or determined using the data. "Trended" also means using the data to predict what future data might be measured at future times, based on the measured or determined trend. Thus, the term "trended" includes predicting how the data may change over a future time period based on changes in the data measured over time in the past.

The output data and/or signals are separated per phase, or by buss cable 28, 30, and 32, to determine which, if any, of the buss cables 28, 30, and 32 may be replaced. In some embodiments, the output data and/or signals of one phase is compared to the output data and/or signals of another phase to determine degradation. In several embodiments, the output data and/or signals of one buss cable 28, 30, and 32 is compared to the output data and/or signals of another buss cable 28, 30, and 32 to determine degradation. In some embodiments, after the PLC 60 has scaled and analyzed the output data and/or signals, the analyzed data may be sent to the data acquisition interface 64 to display the trending data.

By using the PLC 60 and the data acquisition interface 64 to monitor current and voltage of each buss cable 28, 30, and 32 over time, current and voltage shifts can be trended over time to predict the integrity of each of the buss cables 28, 30, and 32. In several embodiments, the data acquisition interface 64 displays the trended measured current and voltage data. The trended data may be in the form of numbers, graphs, or any other display type. The data acquisition interface 64 may also display a predicted time to change each of the buss cables 28, 30, and 32 based on the received data.

In several embodiments, the data acquisition interface 64 and/or the PLC 60 include(s) a non-transitory computer readable medium and a plurality of instructions stored thereon and executable by one or more processors. The instructions may include an algorithm, or a series of algorithms, configured to determine when it is time to replace a degrading one of the buss cables 28, 30, and 32, based on the measured current and voltage data received from the electrical measurement system 44.

In some embodiments, the data acquisition interface 64 and/or the PLC 60 determine(s) that the integrity of a particular buss cable 28, 30, or 32 is compared to a threshold. If the integrity is below the threshold, the particular buss cable 28, 30, or 32 may not need to be replaced. If the integrity threshold is within the threshold, then the particular buss cable 28, 30, or 32 may be determined to be beginning to degrade. In this case, a report may be returned for display to a user. If the integrity is above the threshold, then the particular buss cable 28, 30, or 32 may be replaced.

In some embodiments, during the operation of the system 10, the thermal camera system 62 takes thermal images of each of the buss cables 28, 30, and 32, and converts the thermal images to temperature data, signals, etc. The temperature data, signals, etc. are sent to the PLC 60 and/or the data acquisition interface 64. In some embodiments, the thermal camera system 62 includes a thermal camera per cable. In some embodiments, the thermal camera system 62 includes a thermal camera per phase.

In some embodiments, the thermal camera system 62 measures hot spots on the buss cables 28, 30, and 32. The hot spots are sent to the data acquisition interface 64 and/or PLC 60. In some embodiments, the hot spots are stored and logged in the data acquisition interface 64 and/or the PLC 60. In several embodiments, the stored and logged hot spots include the location of the hot spot on the buss cable 28, 30, and 32, the temperature of the hot spot, which buss cable 28, 30, and 32 has the hot spot, and the like. In some embodiments, the stored and logged hot spots are trended over time to determine which cable is degrading. In some embodiments, the stored and logged hot spots are compared to the measured voltage and/or current output data.

In some embodiments, temperature measurement system, such as the thermal camera system 62, sends data and/or signals to the PLC 60 and/or data acquisition interface 64. In some embodiments, the thermal camera determines which buss cable 28, 30, and 32 has a hot spot. In some embodiments, the PLC 60 or the data acquisition interface determines which buss cable 28, 30, and 32 had the hot spot. In some embodiments, a particular thermal camera is used to measure hot spots on a particular buss cable 28, 30, and 32.

In some embodiments, the temperature data and/or signals that are sent to the PLC 60 may be scaled. In some embodiments, the temperature data and/or signals may also be trended over time using a program such as IGNITION® by Inductive Automation and/or "iba" by iba AG.

In some embodiments, the PLC 60 determines the change in temperature readings (ΔT) of each of the individual water-cooled buss cables 28, 30, and 32. In some embodiments, the PLC 60 compares temperature(s) of each of the buss cable 28, 30, and 32 with a baseline temperature. In some embodiments, the baseline temperature is established in the first few months of use of the buss cables 28, 30, and 32. In some embodiments, modification of the logic of the PLC 60 may be useful to accommodate and scale the temperature data and/or signals.

In some embodiments, modification of IGNITION® and/or "iba" may be useful to add tags and decide on a scan class. In some embodiments, the temperature data and/or signals may be sent directly to the data acquisition interface 64 where it can be displayed.

In some embodiments, using the PLC 60 and/or the data acquisition interface 64, the temperature data may be combined with the measured voltage and current output data to determine a predicted time of degradation of the buss cables 28, 30, and 32. In some embodiments, the temperature data alone may be used to determine a predicted time of degradation of the buss cables 28, 30, and 32.

In some embodiments, the temperature data may be trended over time to determine the state of the buss cables 28, 30, and 32. In some embodiments, the temperature data and/or signals of one phase is compared to the temperature data and/or signals of another phase to determine degradation.

In several embodiments, the temperature data and/or signals of one buss cable 28, 30, and 32 is compared to the temperature data and/or signals of another buss cable 28, 30, and 32 to determine degradation. In some embodiments, the temperature data may be used to confirm the degradation statuses and/or predictions based on the measured current and voltage data. In some embodiments, the measured current and voltage data may be used to confirm the degradation statuses and/or predictions based on the measured temperature data.

Figure 3:
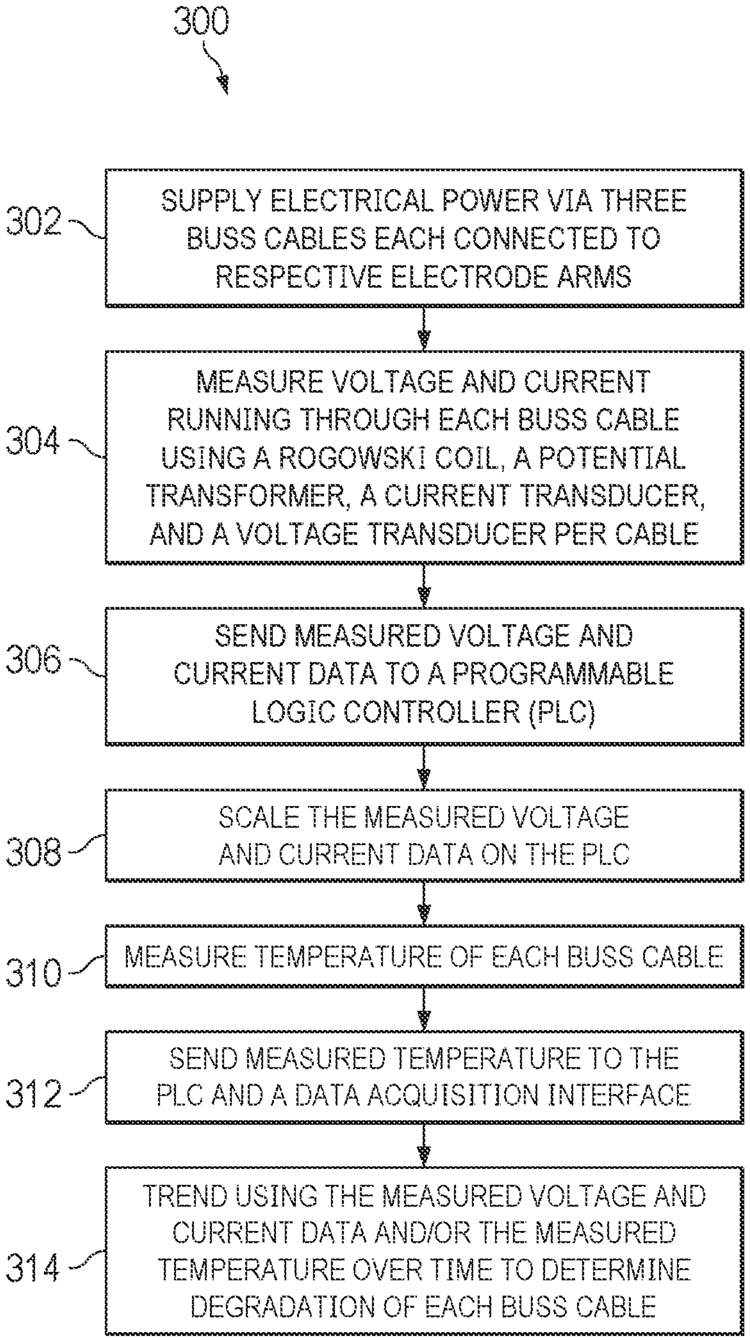
FIG. 3 is a flow chart of a method of monitoring degradation of buss cables using the buss cable monitoring system of FIG. 1, according to one or more embodiments.

Referring to FIG. 3 with continuing reference to FIG. 1 and FIG. 2, a method is generally referred to by reference numeral 300. Method 300 relates, in general, to a method of monitoring the state of degradation of a single buss cable per phase in a three-phase alternating current furnace. It is understood that additional steps can be provided before, during, and after the steps of method 300, and that some of the steps described can be replaced or eliminated for other implementations of this method.

Method 300 includes step 302, at which electrical power is supplied, via the buss cables 28, 30, and 32, to the electrode arms 20, 22, and 24, respectively. At step 304, voltage and current are measured for each of the buss cables 28, 30, and 32. In some embodiments, at step 304, current and voltage of the buss cables 28, 30, and 32 are measured using the Rogowski coils 36, 38, and 40 and the potential transformers 46*a*, 48*a*, and 50*a*, respectively; the voltage transducers 46, 48, and 50, respectively; and the current transducers 52, 54, and 56, respectively.

At step 306, measured voltage and current data and/or signals are sent to the PLC 60. At step 308, the measured voltage and voltage data are scaled using the PLC 60.

At step 310, temperature(s) of each buss cable 28, 30, and 32 are measured using the thermal camera system 62. At step 312, the measured temperature data is sent to the PLC 60 and the data acquisition interface 64.

At step 314, the measured voltage and current data, and/or the measured temperature data, are trended over time to determine degradation of each of the buss cables 28, 30, and 32. In one embodiment, the method of FIG. 3 may terminate thereafter.

In some embodiments, step 310 is executed before or during the execution of step 304. In some embodiments, step 304 is executed before or during the execution of step 310. In some embodiments, step 310 and step 312 is executed before or during the execution of step 304 and step 306.

In some embodiments, at step 304, the measured current and voltage are measured over a predetermined time period. In some embodiments, direct current rather than alternating current is used. Therefore, potential transformers 46*a*, 48*a*, and 50*a* may not be needed. In some embodiments, step 314 is executed using the PLC 60 and/or the data acquisition interface 64. In some embodiments, after step 314, a graphical or numerical representation of the trended voltage and/or current data, and/or temperature data, is displayed on the data acquisition interface 64 and/or an output display in electrical communication therewith. In some embodiments, after step 314, a prediction for when the buss cables 28, 30, and 32 may be replaced is displayed on the data acquisition interface 64 and/or an output display in electrical communication therewith.

In some embodiments, at step 314, the PLC 60 and/or the data acquisition interface 64 determines if any of the water-cooled buss cables 28, 30, and 32 have degraded by determining whether the measured current and voltage data and/or measured temperature data is above (or below) a predetermined threshold. The predetermined threshold is established after determining a baseline value, after a period of one or more months of collecting measured voltage and current data and/or temperature data.

In some embodiments, at step 314, the PLC 60 and/or the data acquisition interface 64 identifies water-cooled buss cables 28, 30, and 32 as degrading but usable when the measured current and voltage data and/or measured temperature data are within a predetermined threshold. The predetermined threshold is established after determining a baseline value and is based on the baseline value.

In some embodiments, at step 314, the PLC 60 and/or the data acquisition interface 64 determine that the water-cooled buss cables 28, 30, and 32 are not degrading and are usable when the measured current and voltage data and/or measured temperature is below (or above) a predetermined threshold. Again, the predetermined threshold may be established after determining a baseline value and using the baseline value.

Figure 4:
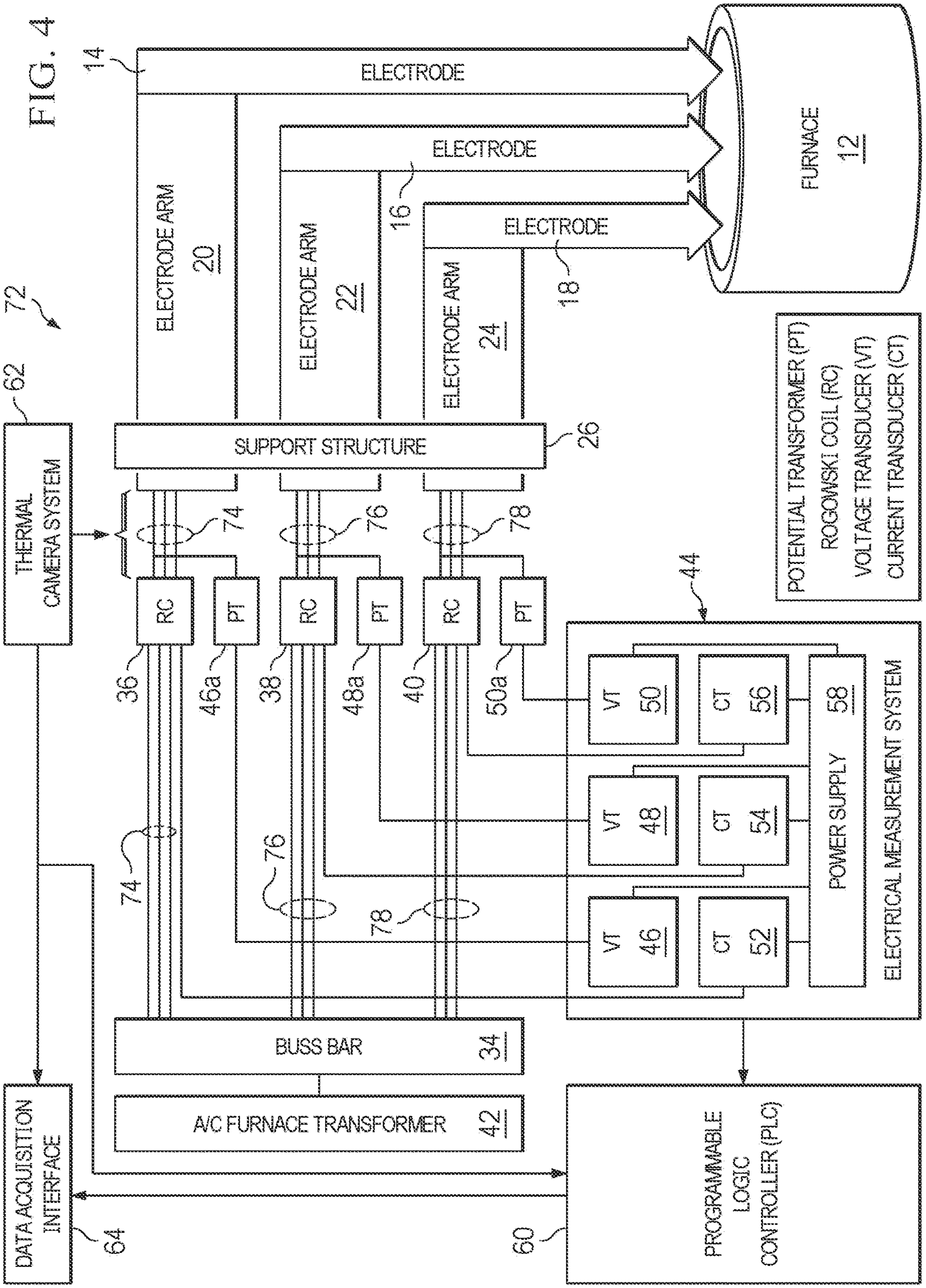
FIG. 4 is a schematic diagram of another buss cable monitoring system, according to one or more embodiments.

Referring to FIG. 4, another embodiment of a buss cable monitoring system is generally referred to by reference numeral 72 and includes several components of the system 10 of FIG. 1. Components in FIG. 4 in common with FIG. 1 are given the same reference numerals.

In the system 72 of FIG. 4, sets of multiple (three or more) buss cables 74, 76, and 78 extend from the buss bar 34 to the electrode arms 20, 22, and 24, respectively. The Rogowski coils 36, 38, and 40 extend around the multiple buss cables 74, 76, and 78, respectively. In several embodiments, each of the sets of buss cables 74, 76, and 78 include water-cooled buss cables. The remainder of the system 72 is substantially identical to the system 10 and therefore will not be described in detail.

In operation, with continuing reference to FIG. 4, while adjusting the voltage level, the AC furnace transformer 42 of the system 72 transfers electricity to the buss bar 34. Ultimately, the electricity is transferred to the electrodes 14, 16, and 18 via the sets of buss cables 74, 76, and 78, respectively. The transfer of electricity to the electrodes 14, 16, and 18 creates electric arcs to melt metals in the furnace 12.

The electrical power supplied to the electrodes 14, 16, and 18, via the sets of buss cables 74, 76, and 78, respectively, is a three-phase electrical power system. Each of the three electrical phases is associated with a separate one of the electrodes 14, 16, and 18. Accordingly, a first phase is associated with electrical power transferred from the AC furnace transformer 42 to the buss bar 34, the set of buss cables 74, the electrode arm 20, and the electrode 14. A second phase is associated with electrical power transferred from the AC furnace transformer 42 to the buss bar 34, the set of buss cables 76, the electrode arm 22, and the electrode 16. A third phase is associated with electrical power transferred from the AC furnace transformer 42 to the buss bar 34, the set of buss cables 78, the electrode arm 24, and the electrode 18.

The remainder of the operation of the system 72 is substantially identical to the above-described operation of the system 10 and therefore will not be described in detail. However, in some embodiments, during operation of the system 72, the thermal camera system 62 may distinguish each individual buss cable in each set of buss cables 74, 76, and 78. Thus, the thermal camera system 62 may measure the temperature in each individual buss cable.

Figure 4B:
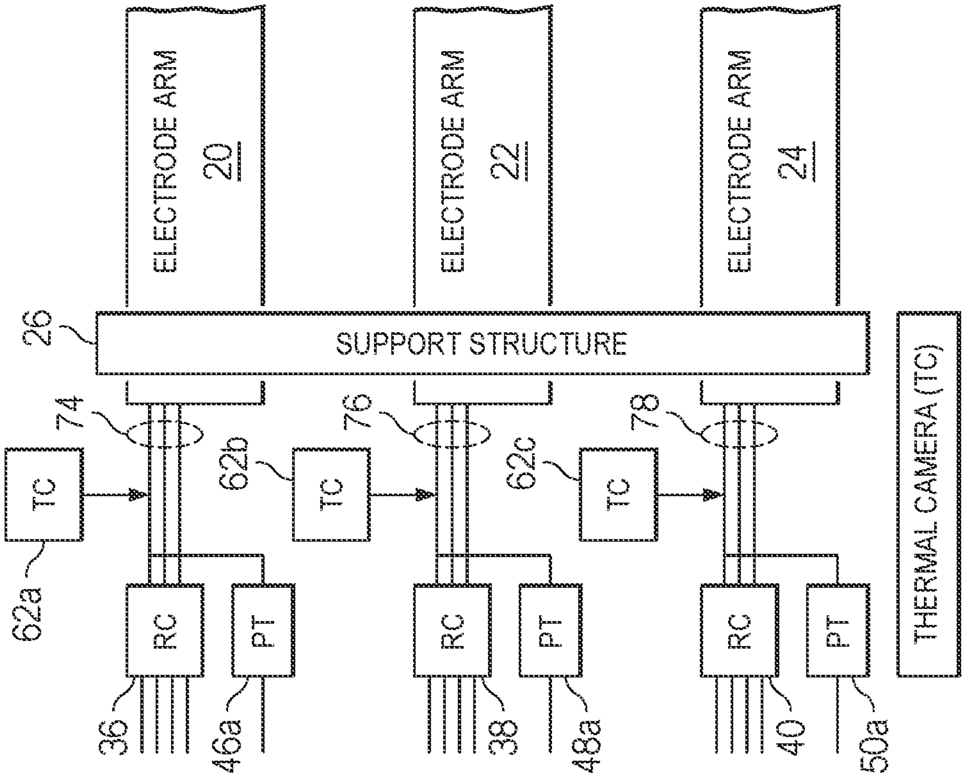
FIG. 4B is a schematic diagram of a portion of the buss cable monitoring system of FIG. 4, the portion including the thermal system of FIG. 4A, according to one or more embodiments.
Figure 4A:
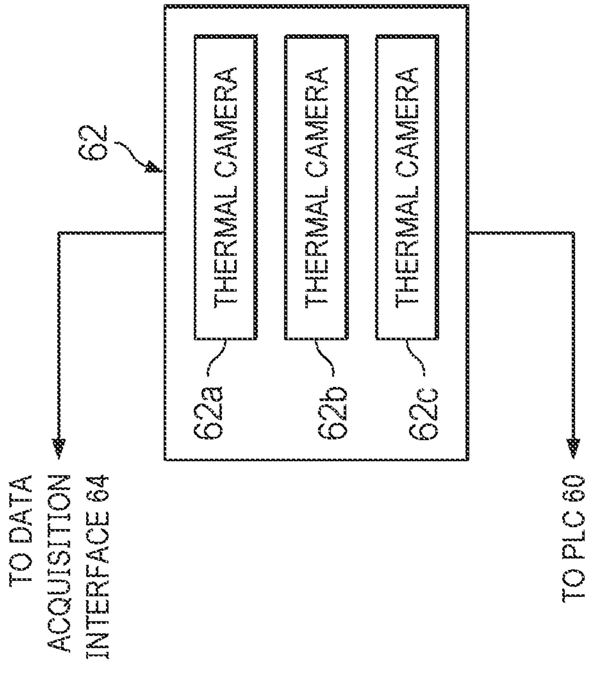
FIG. 4A is a schematic diagram of a thermal camera system of the buss cable monitoring system of FIG. 4, according to one or more embodiments.

Referring to FIG. 4A and FIG. 4B, one embodiment of the thermal camera system 62 of FIG. 4 is shown. Specifically, FIG. 4A depicts the thermal camera system 62 as including thermal cameras 62*a*, 62*b*, and 62*c*. The thermal cameras 62*a*, 62*b*, and 62*c* send their respective outputs to the PLC 60 and/or the data acquisition interface 64.

The outputs of the thermal cameras 62*a*, 62*b*, and 62*c* include hots spot(s) data. Hot spot(s) data may include any one or more of: images, measured temperatures, measured hot spots, measured location(s) of hot spot(s), a particular buss cable that has a measured hot spot, and the like.

As shown in FIG. 4B, the thermal cameras 62*a*, 62*b*, and 62*c* are located to be operably associated with the sets of buss cables 74, 76, and 78, respectively. More particularly, the thermal camera 62*a* is set up to measure hot spot(s) data of the first set of multiple buss cables 74. The thermal camera 62*b* is set up to measure hot spot(s) data of the second set of multiple buss cables 76. The thermal camera 62*c* is set up to measure the third set of multiple buss cables 78.

In operation, with continuing reference to FIG. 4A and FIG. 4B, the thermal camera system 62 uses the thermal cameras 62*a*, 62*b*, and 62*c* to monitor and capture hot spot(s) data, such as temperature and locations of hot spots of the three phases. The thermal camera 62*a* monitors the first set of multiple buss cables 74. The thermal camera 62*b* monitors the second set of multiple buss cables 76. The thermal camera 62*c* monitors the third set of multiple buss cables 78. The thermal cameras 62*a*, 62*b*, and 62*c* measure the hot spots on their respective sets of multiple buss cables 74, 76, and 78 and send the measured hot spot(s) data to the PLC 60 and/or the data acquisition interface 64 to be stored.

In some embodiments, each of the thermal cameras 62*a*, 62*b*, and 62*c* may distinguish between each cable in each of the sets of multiple buss cables 74, 76, and 78, respectively. In some embodiments, each of the thermal cameras 62*a*, 62*b*, and 62*c* may not be able to distinguish between each cable in each of the sets of buss cables 74, 76, and 78, respectively.

Figure 4D:
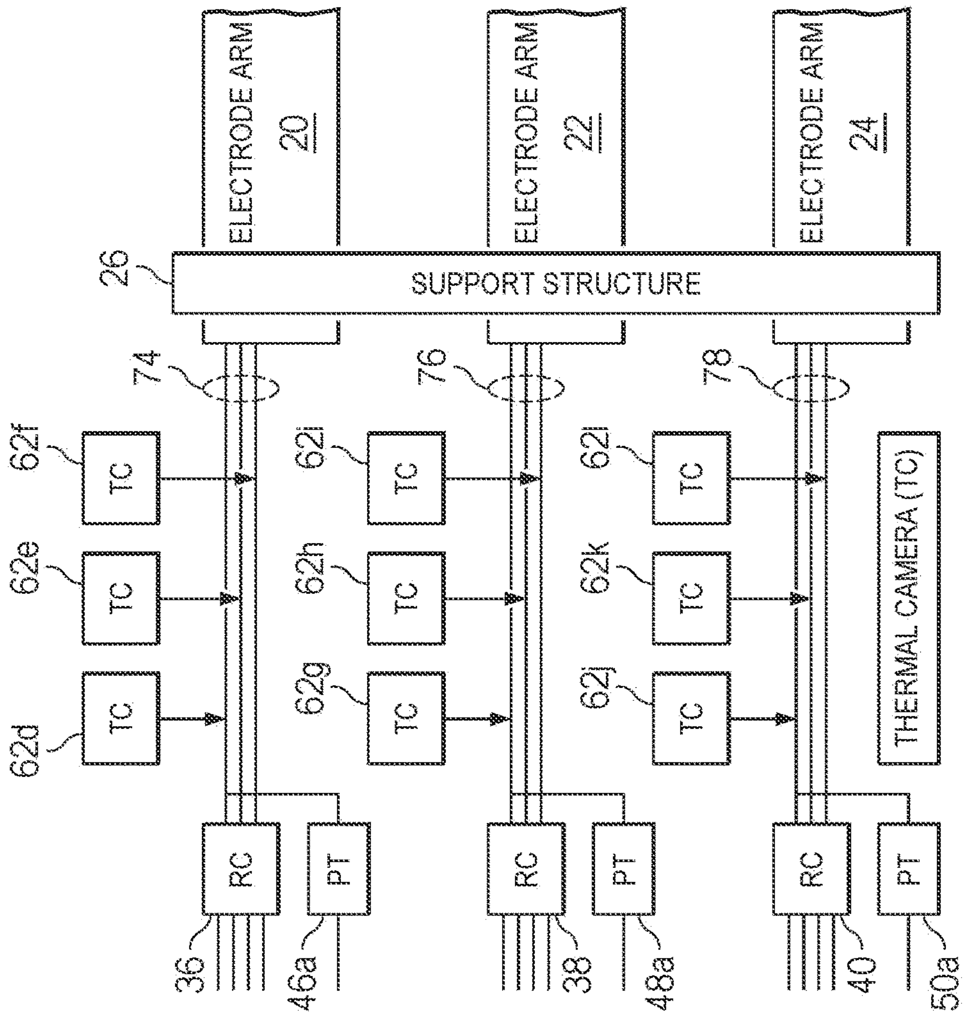
FIG. 4D is a schematic diagram of a portion of the buss cable monitoring system of FIG. 4, the portion including the thermal camera system of FIG. 4C, according to one or more embodiments.
Figure 4C:
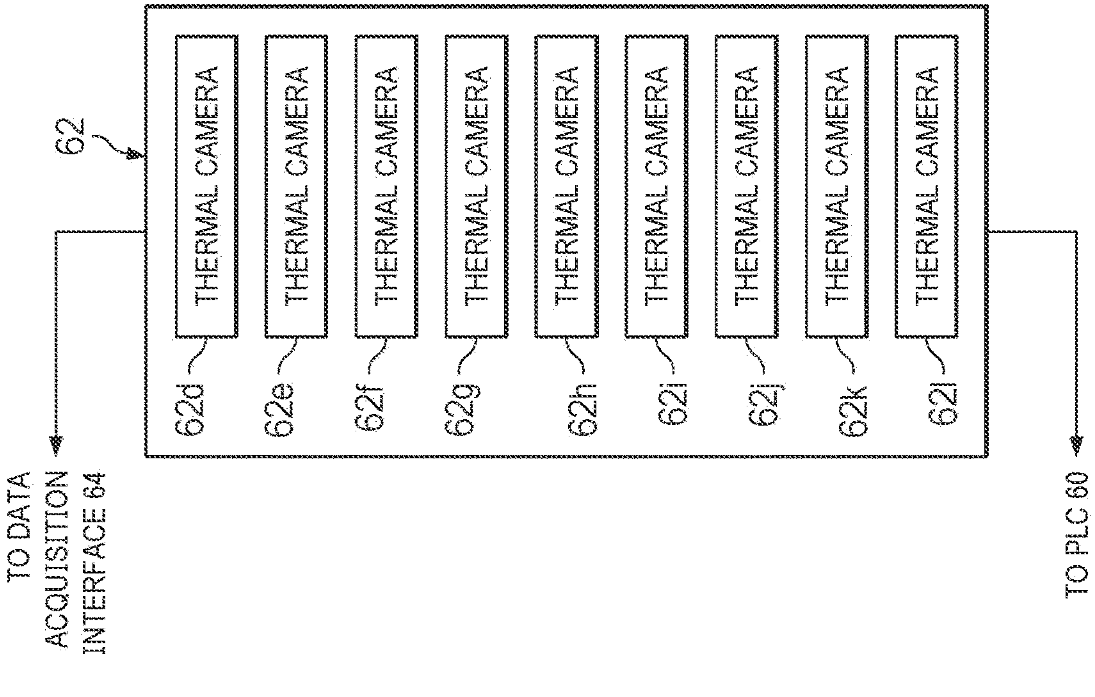
FIG. 4C is a schematic diagram of a thermal camera system of the buss cable monitoring system of FIG. 4, according to one or more embodiments.

Referring to FIG. 4C and FIG. 4D, another embodiment of the thermal camera system 62 is shown. Specifically, the thermal camera system 62 includes thermal cameras 62*d*, 62*e*, 62*f*, 62*g*, 62*h*, 62*i*, 62*j*, 62*k*, and 62*l*. These thermal cameras send their respective outputs to the PLC 60 and/or the data acquisition interface 64.

The outputs of the thermal cameras 62*d*, 62*e*, 62*f*, 62*g*, 62*h*, 62*i*, 62*j*, 62*k*, and 62*l* include hots spot(s) data. Hot spot(s) data may include any one or more of thermal images, measured temperatures, hot spots, measured locations of hot spots, digital signals, and the like. As shown in FIG. 4D, the thermal cameras 62*d*, 62*e*, 62*f*, 62*g*, 62*h*, 62*i*, 62*j*, 62*k*, and 62*l* each monitor their own respective buss cable. In some embodiments, the number of thermal cameras in the thermal camera system 62 is proportional to the number of buss cables. In other embodiments, the number of thermal cameras in the thermal camera system 62 is not proportional to the number of buss cables.

In operation, with continuing reference to FIG. 4C and FIG. 4D, each buss cable is individually measured for hot spot(s) data. For example, the thermal camera 62*d* measures the first buss cable in the first set of buss cables 74. The thermal camera 62*e* measures the second buss cable in the first set of buss cables 74. The thermal camera 62*f* measures the third buss cable in the first set of buss cables 74.

The thermal camera 62*g* measures the first buss cable in the second set of buss cables 76. The thermal camera 62*h* measures the second buss cable in the second set of buss cables 76. The thermal camera 62*i* measures the third buss cable in the second set of buss cables 76.

The thermal camera 62*j* measures the first buss cable in the third set of buss cables 78. The thermal camera 62*k* measures the second buss cable in the third set of buss cables 78. The thermal camera 62*l* measures the third buss cable in the third set of buss cables 78.

The thermal cameras 62*d*, 62*e*, 62*f*, 62*g*, 62*h*, 62*i*, 62*j*, 62*k*, and 62*l* measure hot spots and/or temperatures on their respective buss cable and send that hot spot(s) data to the PLC 60 and/or data acquisition interface 64. The hot spot(s) data may be thermal images, digital signals, temperature data, location data of the hot spots (buss cable and location on buss cable), and other similar outputs. The hot spot(s) data is then stored in the PLC 60 and/or data acquisition interface 64.

Figure 5A:
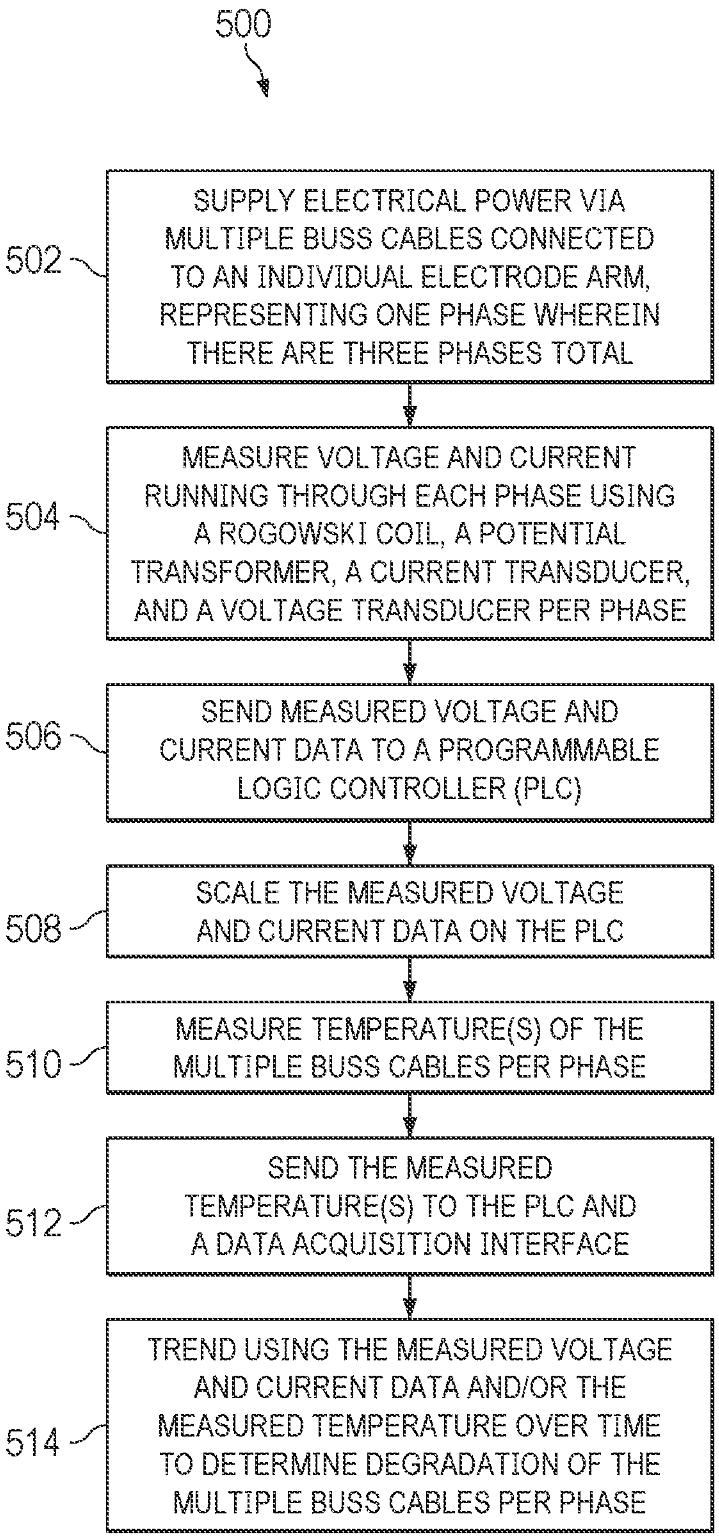
FIG. 5A is a flow chart of a method of monitoring degradation of buss cables using the buss cable monitoring system of FIG. 4, according to one or more embodiments.

Referring to FIG. 5A with continuing reference to FIG. 4, a method is generally referred to by reference numeral 500. Method 500 relates, in general, to a method of monitoring the state of degradation of multiple buss cables per phase in a three-phase alternating current furnace. It is understood that additional steps can be provided before, during, and after the steps of method 500, and that some of the steps described can be replaced or eliminated for other implementations of this method.

Method 500 includes step 502, at which electrical power is supplied, via the sets of multiple buss cables 74, 76, and 78, to the electrode arms 20, 22, and 24, respectively. Each of the electrode arms 20, 22, and 24 are associated with one phase, wherein there are three phases total.

At step 504, voltage and current are measured for each of the sets of multiple buss cables 74, 76, and 78. In some embodiments, at step 504, current of the sets of multiple buss cables 74, 76, and 78 are measured using the Rogowski coils 36, 38, and 40. The measured current is sent to the current transducers 52, 54, and 56, respectively. Voltage of the sets of multiple buss cables 74, 76, and 78 are measured using the potential transformers 46*a*, 58*a*, and 50*a*, respectively. The resulting output voltage is sent to the voltage transducers 46, 48, and 50, respectively.

At step 506, measured voltage and current data and/or signals are sent to the PLC 60. At step 508, the measured voltage and voltage data are scaled using the PLC 60.

At step 510, temperature(s) of each set of multiple buss cables 74, 76, and 78 are measured using the thermal camera system 62. At step 512, the measured temperature data is sent to the PLC 60 and the data acquisition interface 64.

At step 514, the measured voltage and current data, and/or the measured temperature data, are trended over time to determine degradation of each of the sets of multiple buss cables 74, 76, and 78. The determined degradation then may be returned to a user, such as by displaying the determined degradation on a display device, storing the determined degradation, printing the determined degradation, etc. The determined degradation also may be supplied to an automated process. For example, the determined degradation may be provided to a controller. The controller may switch off a metal melting system when the determined degradation reaches the threshold. In one embodiment, the method of FIG. 5B may terminate thereafter.

In some embodiments, potential transformers 46*a*, 48*a*, and 50*a* are not used in step 504. Specifically, when the electrical power being supplied is direct current, rather than alternating current, the potential transformers need not be used.

In some embodiments, step 510 is executed before or during the execution of step 504. In some embodiments, step 504 is executed before or during the execution of step 510. In some embodiments, step 510 and step 512 are executed before or during the execution of step 504 and step 506.

In some embodiments, at step 504, the measured current and voltage are measured over a predetermined time period. In some embodiments, step 514 is executed using the PLC 60 and/or the data acquisition interface 64. In some embodiments, at step 514, a graphical or numerical representation of the trended voltage and/or current data, and/or temperature data, is displayed on the data acquisition interface 64 and/or an output display in electrical communication therewith. In some embodiments, at step 514, a prediction for when the sets of multiple buss cables 74, 76, and 78 should be replaced is displayed on the data acquisition Interface 64 and/or an output display in electrical communication therewith.

In some embodiments, at step 514, the PLC 60 and/or the data acquisition interface 64 determines if any of the sets of multiple buss cables 74, 76, and 78 have degraded by determining whether the measured current and voltage data and/or measured temperature data is above (or below) a predetermined threshold. The predetermined threshold is established after determining a baseline value, after one or more months of collecting measured voltage and current data and/or temperature data.

In some embodiments, at step 514, the PLC 60 and/or the data acquisition interface 64 identifies the sets of buss cables 74, 76, and 78 as degrading but usable when the measured current and voltage data and/or measured temperature data are within a predetermined threshold. The threshold is established after determining a baseline value and is established using the baseline value.

In some embodiments, at step 514, the PLC 60 and/or the data acquisition interface 64 determine that the sets of multiple buss cables 74, 76, and 78 are not degrading. In this case, the sets of multiple buss cables may be usable when the measured current and voltage data and/or measured temperature is below (or above) a predetermined threshold. The predetermined threshold is established after determining a baseline value and is based on the baseline value.

Figure 5B:
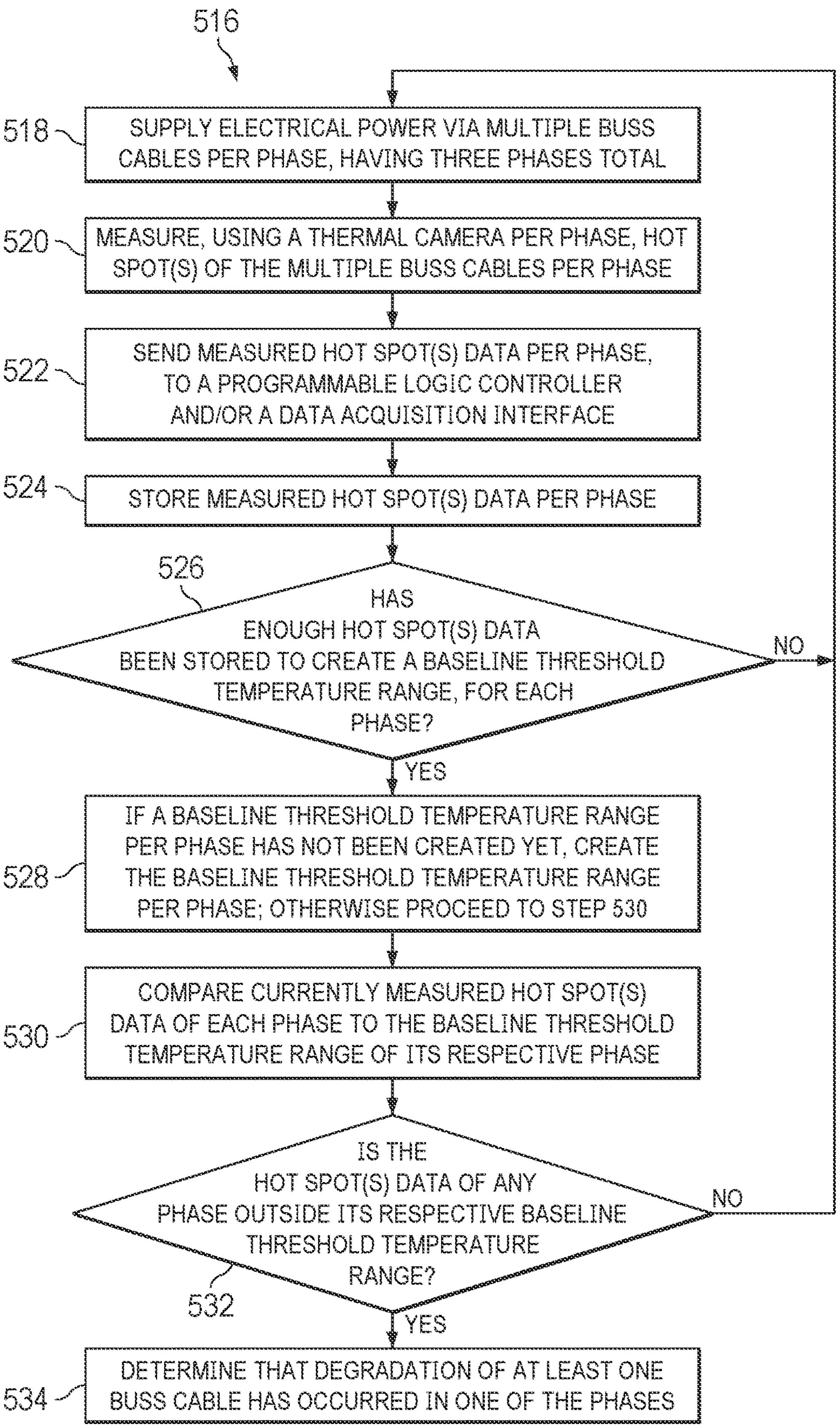
FIG. 5B is a flow chart of a method of monitoring degradation of buss cables using the buss cable monitoring system of FIG. 4 and the thermal camera system of FIG. 4A and FIG. 4B, according to one or more embodiments.

Referring to FIG. 5B, with continuing reference to FIG. 4, FIG. 4A and FIG. 4B, a method is generally referred to by reference numeral 516. Method 516 relates, in general, to a method of monitoring the state of degradation of multiple buss cables per phase in a three-phase alternating current furnace using thermal cameras 62*a*, 62*b*, and 62*c*. It is understood that additional steps can be provided before, during, and after steps of method 516, and that some of the steps described can be replaced or eliminated for other implementations of this method.

Method 516 includes step 518, at which electrical power is supplied via multiple buss cables per phase, having three phases total. Step 520 includes measuring, per phase, hot spot(s) of the multiple buss cables. Measuring may be performed using a thermal camera 62*a*, 62*b*, and 62*c* per phase.

Step 522 includes sending, per phase, measured hot spot(s) data to the programmable logic controller 60 and/or the data acquisition interface 64. Step 524 includes storing, per phase, the hot spot(s) data.

Step 526 includes determining whether enough hot spot(s) data been stored to create a baseline threshold temperature range, for each phase. If not (a "no" determination at step 526), method 516 proceeds to step 518. If so (a "yes" determination at step 526), then method 516 proceeds to step 528.

Step 528 includes creating the baseline threshold temperature range per phase, if a baseline threshold temperature range per phase has not been created yet. Otherwise, method 516 proceeds to step 530. Step 530 compares currently measured hot spot(s) data of each phase to the baseline threshold temperature range of its respective phase.

Then, Step 532 includes determining whether the hot spot(s) data of any phase outside its respective baseline threshold temperature range. If not (a "no" determination at step 532), then method 516 proceeds to step 518. If so (a "yes" determination at step 532) then method 516 proceeds to step 534. Step 534 includes determining that the degradation of at least one buss cable has occurred in at least one of the phases.

In some embodiments, electrical power is supplied to only one buss cable per phase in step 518. In some embodiments, electrical power is not supplied as alternating current. In some embodiments, multiple buss cables include three or more buss cables per phase. In other embodiments, two buss cables per phase are used and are connected in parallel.

In some embodiments, at step 520, three thermal cameras may be used to measure hot spots. In some embodiments, the thermal cameras 62*a*, 62*b*, and 62*c* are used to measure hot spots in the set of buss cables 74, 76, and 78, respectively.

In some embodiments, the thermal cameras 62*a*, 62*b*, and 62*c* can distinguish which cable in the set of buss cables has the hot spot. In other embodiments, the thermal cameras 62*a*, 62*b*, and 62*c* cannot distinguish which cable in the set of buss cables 74, 76, and 78 has the hot spot. Instead, the cameras may only determine that a hot spot is on one of the multiple buss cables 74, 76, and 78 in the respective set or phase.

In some embodiments, any one or more of: temperature, hot spot(s), location of hot spot(s) on a buss cable, which buss cable has hot spot(s); and the like, may be measured. In some embodiments, it is the lack of a hot spot that is measured.

In some embodiments, at step 522, measured hot spot(s) data per phase includes: images, signals, temperature readings, location data; and the like. In some embodiments, measured hot spot(s) data is sent per buss cable, but stored in step 524 as hot spot(s) data for its respective phase. In some embodiments, measured hot spot(s) data is sent per phase and/or set of multiple buss cables 74, 76, and 78 to the PLC 60 and/or the data acquisition interface 64.

In some embodiments, at step 524, the measured hot spot(s) data per phase is stored in either the PLC 60 and/or the data acquisition interface 64. In some embodiments, the stored measured hot spot(s) data is trended. In some embodiments, the measured hot spot(s) data is stored per buss cable rather than per phase and/or set of multiple buss cables 74, 76, and 78.

In some embodiments, at step 526, the system 72 or an application of the system 72 determines if enough hot spot(s) data has been stored to create a baseline threshold temperature range, for each phase. In some embodiments, each buss cable has a different baseline threshold temperature range. In other embodiments, the same baseline threshold temperature range may be used for all three phases.

In some embodiments, the baseline threshold temperature range is the predetermined threshold. In other embodiments, the baseline threshold temperature range is a range of temperatures with a maximum and a minimum value that is considered normal temperature values for the particular phase. In some embodiments, the measured hot spot(s) data per phase are taken for a predetermined time (e.g., two to three months) and averaged to determine the baseline threshold temperature range per phase.

In some embodiments, a baseline threshold temperature range has not been created yet. For example, there may not be enough data to create a baseline threshold temperature range. Thus, method 516 proceeds to step 518. If there is enough stored measured hot spot(s) data, then step 526 proceeds to step 528.

In some embodiments, step 528 is omitted and method 516 proceeds to step 530. In some embodiments, a baseline threshold temperature range is created after taking hot spot(s) data per phase for a few months. In some embodiments, a known baseline threshold temperature range is input into the PLC 60 and/or the data acquisition interface 64 prior to step 518 and there is no need to create a baseline threshold temperature range.

In some embodiments, step 530 compares the last measured hot spot(s) data for a phase to the baseline threshold temperature range of that phase. In some embodiments, only one phase is compared. In other embodiments, all hot spot(s) data per phase are compared to their respective baseline threshold temperature range. In some embodiments, respective temperature values and/or ranges are compared. In other embodiments, location of hot spot(s) is also analyzed at this step. In some embodiments, thermal images are compared.

In some embodiments, step 532 determines if the measured hot spot(s) data of any phase is outside its respective baseline threshold temperature range to determine if degradation has occurred. If the measured hot spot(s) data of the three phrases are within the three threshold temperature ranges (a "no" determination at step 532), then method 516 begins again by returning to step 518. However, if the measured hot spot(s) data is outside the baseline threshold temperature range of one or more of the phases (a "yes" determination at step 532), then the method proceeds to step 534.

In some embodiments, the measured hot spot(s) data may be trended at this stage to determine if a particular phase has been showing a changing temperature trend. In some embodiments, the trended temperature for a particular phase is used instead of using a baseline threshold temperature range for that phase.

In some embodiments, the hot spot(s) data of the three phases may be compared with one another to determine if one of the phases differs from the other two phases. In this manner, it is possible to determine if the buss cable(s) in one or more of the phases are degrading. Accordingly, it may be possible to avoid using a baseline threshold temperature range to accomplish the one or more embodiments.

In one or more embodiments, the hot spot(s) data of a phase may be compared to the measured voltage and current data of that phase to determine if a similar trend is being seen. In other embodiments, the trended temperature and/or hot spot(s) data for a particular phase, the measured voltage and current data of a particular phase, and the comparison of hot spot(s) data between phases may be used alongside the baseline threshold temperature range to determine if a phase has one or more buss cable(s) degrading.

In some embodiments, at step 534, the PLC 60 and/or the data acquisition interface 64 determines that at least one buss cable has degraded. In some embodiments, when one phase (whether for one buss cable or multiple buss cables) begins to degrade or fail, then the other two phases may begin to show an increase in temperature.

In some embodiments, the PLC 60 and/or data acquisition interface 64 will determine that a phase is below the baseline threshold temperature range and is therefore degrading. In other embodiments, the PLC 60 and/or data acquisition interface 64 will determine that one or two phases are over the baseline threshold temperature range, and therefore another phase is likely degrading.

In this example, the phase that has the lowest temperature may be determined as degrading. In some embodiments, only the particular phase may be identified as degrading but not a particular cable in the set of multiple buss cables 74, 76, and 78 of the particular phases.

In other embodiments, the particular buss cable(s) that are degrading in a phase may be determined as degrading. In some embodiments, a phase is not determined as having buss cable(s) that are degrading, unless buss cable(s) have continued to have measured temperatures outside the baseline threshold temperature range for a set period of time.

In some embodiments, a user or the PLC 60 and/or the data acquisition interface 64 may verify if a phase appears to be degrading by comparing it to the other two phases, by comparing it to how that temperature in that phase has been trending over time, or by comparing it to the measured voltage and current data of the particular phase. Other variations are possible.

In some embodiments, method 516 further includes identifying which phase has degraded. In some embodiments, method 516 further includes identifying which buss cable(s) of a particular phase is degrading. In some embodiments, method 516 occurs contemporaneously with, or in place of method 500.

Figure 5C:
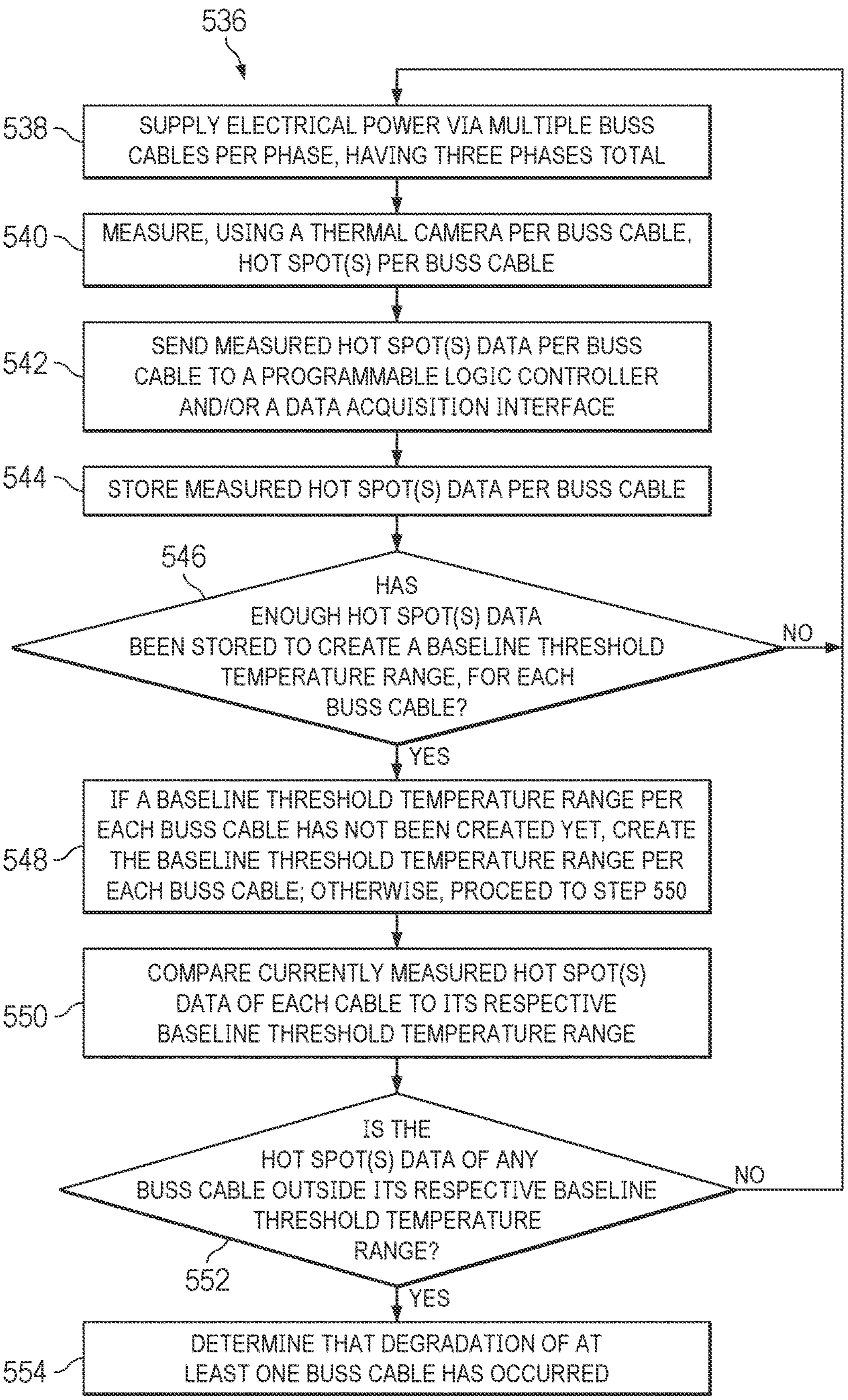
FIG. 5C is a flow chart of a method of monitoring degradation of buss cables using the buss cable monitoring system of FIG. 4 and the thermal camera system of FIG. 4C and FIG. 4D, according to one or more embodiments.

Referring to FIG. 5C, with continuing reference to FIG. 4, FIG. 4C and FIG. 4D, a method is generally referred to by reference numeral 536. Method 536 relates, in general, to a method of monitoring the state of degradation of multiple buss cables per phase in a three-phase alternating current furnace using a thermal camera 62*d*, 62*e*, 62*f*, 62*g*, 62*h*, 62*i*, 62*j*, 62*k*, and 62*l* per buss cable. It is understood that additional steps can be provided before, during, and after the steps of method 536, and that some of the steps described can be replaced or eliminated for other implementations of this method.

Method 536 includes step 538, at which electrical power is supplied via multiple buss cables per phase. In the example of method 536, there are three phases total.

Step 540 includes measuring hot spot(s) of each buss cables using a thermal camera 62*d*, 62*e*, 62*f*, 62*g*, 62*h*, 62*i*, 62*j*, 62*k*, and 62*l* per buss cable. Step 542 includes sending measured hot spot(s) data per buss cable to the programmable logic controller 60 and/or the data acquisition interface 64.

Step 544 includes storing the hot spot(s) data per buss cable. Step 546 includes determining whether enough hot spot(s) data been stored to create a baseline threshold temperature range, for each buss cable. If not (a "no determination at step 536), then method 536 proceeds to step 538. If so (a "yes" determination at step 536), then method 536 proceeds to step 548. Otherwise, method 536 proceeds to step 550.

Step 548 includes creating the baseline threshold temperature range per buss cable, if a baseline threshold temperature range per buss cable has not been created yet. Step 550 compares currently measured hot spot(s) data of each buss cable to respective baseline threshold temperature ranges of each buss cable.

Step 552 include determining whether the hot spot(s) data of any buss cable is outside its respective baseline threshold temperature range. If not (a "no" determination at step 552), then method 536 proceeds to step 538. If so (a "yes" determination at step 552), then method 536 proceeds to step 554.

Step 554 includes determining that the degradation of at least one buss cable has occurred. In one embodiment, the method of FIG. 5C may terminate thereafter.

In some embodiments, electrical power may be supplied to only one buss cable per phase in step 538. In some embodiments, electrical power is not supplied as alternating current. In some embodiments, multiple buss cables include three or more buss cables per phase. In other embodiments, two buss cables per phase are used and are connected in parallel.

In some embodiments, at step 540, nine thermal cameras 62*d*, 62*e*, 62*f*, 62*g*, 62*h*, 62*i*, 62*j*, 62*k*, and 62*l* may be used to measure hot spots on a particular buss cable. In some embodiments, thermal cameras 62*a*, 62*b*, and 62*c* may be used to measure hot spots of each buss cable in the set of buss cables 74, 76, and 78 respectively. In this case, the three thermal cameras 62*a*, 62*b*, and 62*c* may be capable of distinguishing which buss cable had a hot spot.

In some embodiments, any one or more of: temperature; hot spot(s); location of hot spot(s) on a buss cable; which buss cable has hot spot(s); and the like, are measured. In some embodiments, a determination may be made or measured that no hot spot is present. In some embodiments, the number of thermal cameras may be directly proportional to the number of buss cables. Therefore, more or fewer thermal cameras may be used by the thermal camera system 62.

In some embodiments, at step 542, measured hot spot(s) data per buss cable includes: images, signals, temperature readings, location data, and the like. In some embodiments, measured hot spot(s) data may be sent via the thermal cameras 62*d*, 62*e*, 62*f*, 62*g*, 62*h*, 62*i*, 62*j*, 62*k*, and 62*l* per buss cable to the PLC 60 and/or the data acquisition interface 64.

In some embodiments, at step 544, the measured hot spot(s) data per phase may be stored in either the PLC 60 and/or the data acquisition interface 64. In some embodiments, the stored measured hot spot(s) data may be trended per buss cable. In some embodiments, the measured hot spot(s) data may be stored per buss cable rather than per phase.

In some embodiments, at step 546, the system 72 or an application of the system 72 may determine if enough hot spot(s) data has been stored to create a baseline threshold temperature range, for each buss cable. In some embodiments, each buss cable may have a different baseline threshold temperature range.

In other embodiments, the same baseline threshold temperature range may be used for all buss cables. In some embodiments, the baseline threshold temperature range may be the predetermined threshold.

In other embodiments, the baseline threshold temperature range may be a range of temperatures with a maximum and a minimum value that is considered normal temperature values for the particular buss cable. In some embodiments, the measured hot spot(s) data per buss cable may be taken for a predetermined time (e.g., two to three months) and averaged to determine the baseline threshold temperature range per buss cable.

In some embodiments, a baseline threshold temperature range has not been created yet. For example, not enough data may be available to create a baseline threshold temperature range. In this case, method 536 proceeds to step 538. If there is enough stored measured hot spot(s) data, then step 546 proceeds to step 548.

In some embodiments, step 548 may be omitted and method 536 proceeds to step 550. In some embodiments, baseline threshold temperature ranges may be created after taking hot spot(s) data per buss cable for a few months.

In some embodiments, a known baseline threshold temperature range may be input into the PLC 60 and/or the data acquisition interface 64 prior to step 538. In this case, there is no need to create a baseline threshold temperature range.

In some embodiments, step 550 compares the last measured hot spot(s) for a buss cable to the baseline threshold temperature range of that buss cable. In some embodiments, only one buss cable is compared.

In other embodiments, all buss cables are analyzed. In other embodiments, only the buss cables in a particular phase are compared.

In some embodiments, temperature values and/or ranges are compared. In other embodiments, locations of hot spot(s) are also analyzed at this step. In some embodiments, thermal images are compared.

In some embodiments, step 552 determines if the measured hot spot(s) data of any buss cable is outside its respective baseline threshold temperature range to determine if degradation has occurred. For example, if the measured hot spot(s) data of the three buss cables are within the respective three temperature threshold ranges, then method 536 begins again by starting at step 538. However, if the measured hot spot(s) data is outside the baseline threshold temperature range of one or more of the buss cables, then the method may proceed to step 554.

In some embodiments, the measured hot spot(s) data may be trended at this stage to determine if a particular buss cable has been showing an increasing temperature trend or a decreasing temperature trend. In some embodiments, the trended temperature for a particular buss cable may be used instead of using a baseline threshold temperature range for that buss cable.

In some embodiments, the hot spot(s) data of all of the buss cables may be compared with one another to determine if one of the buss cables differs from the buss cables to determine if the buss cable(s) is degrading, instead of using a baseline threshold temperature range. In some embodiments, only buss cables in a particular phase may be compared with one another.

In one or more embodiments, the hot spot(s) data of a buss cable may be compared to the measured voltage and current data of the buss cable to determine if a similar trend is being seen. In other embodiments, the trended temperature for a particular buss cable, the measured voltage and current data of a particular buss cable, and the comparison of hot spot(s) data between buss cables may be used alongside the baseline threshold temperature range to determine if one or more buss cable(s) is degrading.

In some embodiments, at step 554, the PLC 60 and/or the data acquisition interface 64 determines that at least one buss cable has degraded. In some embodiments, the PLC 60 and/or data acquisition interface 64 may determine that a buss cable is below the baseline threshold temperature range and is therefore potentially degrading.

In other embodiments, the PLC 60 and/or data acquisition interface 64 may determine that a buss cable is over the baseline threshold temperature range, and therefore another buss cable is likely degrading. In this example, the buss cable that has the lowest temperature may be determined as degrading if the buss cable is outside the baseline threshold temperature range. The lack of heat may signal that the buss cable is degrading.

In some embodiments, the particular buss cable(s) that are degrading in a phase may be determined as degrading and identified accordingly. In some embodiments, a buss cable is not determined as degrading unless buss cable has continued to have measured temperatures outside its baseline threshold temperature range for a set period of time.

In some embodiments, a user or the PLC 60 and/or the data acquisition interface 64 may verify if a buss cable appears to be degrading by comparing the buss cable to the other buss cables within its phase, by comparing the buss cable to all of the buss cables of the system 72, by comparing it to how that temperature in that buss cable has been trending over time, or by comparing it to the measured voltage and current data of the particular buss cable.

In some embodiments, method 516 may occur before method 536. In this case, method 516 determines which phase is degrading and method 536 determines which buss cable(s) of the degrading phase is/are degrading. In some embodiments, method 536 occurs concurrently with, or in place of method 500 or method 516.

In some embodiments, when one phase begins to degrade or fail, then the other two phases will begin to show an increase in temperature. In some embodiments, one buss cable out of multiple buss cables may be degrading. In other embodiments, multiple buss cables may be degrading out of multiple buss cables per phase.

In some embodiments, methods 500, 516, and 536 may further include sending a notification or alert to the data acquisition interface 64 and/or PLC 60 to check the buss cable(s) of a particular phase. The check may be measure or determine potentially degrading buss cables, or to verify if the measured voltage and current data is trending towards buss cable degradation.

Figure 6:
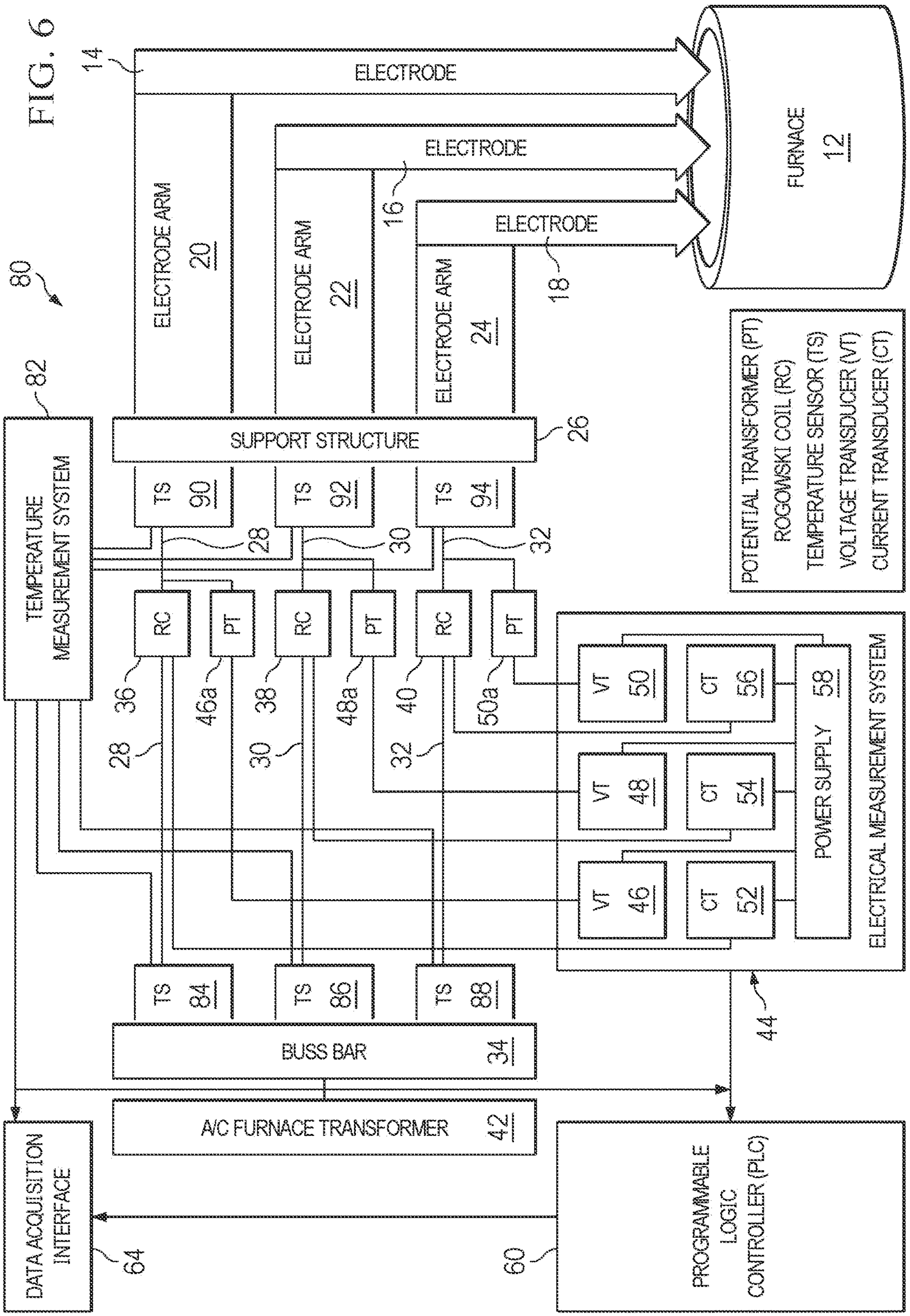
FIG. 6 is a schematic diagram of yet another buss cable monitoring system, according to one or more embodiments.

Referring to FIG. 6, yet another embodiment of a buss cable monitoring system is generally referred to by reference numeral 80 and includes several components of the system 10 of FIG. 1. Thus, reference numerals in FIG. 6 in common with reference numerals in FIG. 1 may share common reference numerals.

In the system 80 of FIG. 6, the thermal camera system 62 may be omitted in favor of a temperature measurement system 82. Temperature sensors 84, 86, 88, 90, 92, and 94 may be operably coupled to the temperature measurement system 82. The temperature sensors 84 and 90 may be positioned at opposing end portions of the buss cable 28. The temperature sensors 86 and 92 may be positioned at opposing end portions of the buss cable 30. The temperature sensors 88 and 94 may be positioned at opposing end portions of the buss cable 32.

In some embodiments, the temperature measurement system 82 is in electrical communication with each of the temperature sensors 84, 86, 88, 90, 92, and 94. In some embodiments, one or more of the temperature sensors 84, 86, 88, 90, 92, and 94 is, or includes, a thermocouple, a thermistor, another type of temperature sensor, or any combination thereof. In several embodiments, the temperature measurement system 82 includes a computing node, a signal processor, controller(s), or any combination thereof.

In operation, the temperature sensors 84 and 90, 86 and 92, and 88 and 94 measure temperatures of the buss cables 28, 30, and 32, respectively, sending temperature data and/or signals to the temperature measurement system 82. The temperature measurement system 82 sends the temperature data and/or signals to the PLC 60 and/or the data acquisition interface 64.

The temperature data and/or signals are measured over time to predict the degradation of the buss cable 28, 30, and 32. The temperature data and/or signals may be scaled using the PLC 60.

The temperature data and/or signals may be trended over time using the PLC 60 and/or the data acquisition interface 64 to determine a prediction for the degradation of the buss cable 28, 30, and 32. The data and/or signals from the temperature measurement system 82 may be used individually or in conjunction with the measured current and voltage data collected from the electrical measurement system 44 to determine the current status of each of the buss cables 28, 30, and 32, and the future degradation of the buss cable 28, 30, and 32

In some embodiments, the system 80 of FIG. 6 includes the thermal camera system 62 of the system 10 of FIG. 1. Thus, in some embodiments, the thermal camera system 62 may be operably coupled to the temperature measurement system 82.

In some embodiments, the temperature measurement system 82, such as a thermal camera, sends temperature data and/or signals to the PLC 60 and/or the data acquisition interface 64. In some embodiments, the temperature measurement system includes a plurality of thermal cameras, where one thermal camera measures one buss cable 28, 30, and 32.

In some embodiments, the temperature measurement system 82 sends temperature data and/or signals to the PLC 60 and/or the data acquisition interface 64. The temperature measurement system 82 may include one or more of temperature sensors 84, 86, 88, 90, 92, and 94.

Figure 7:
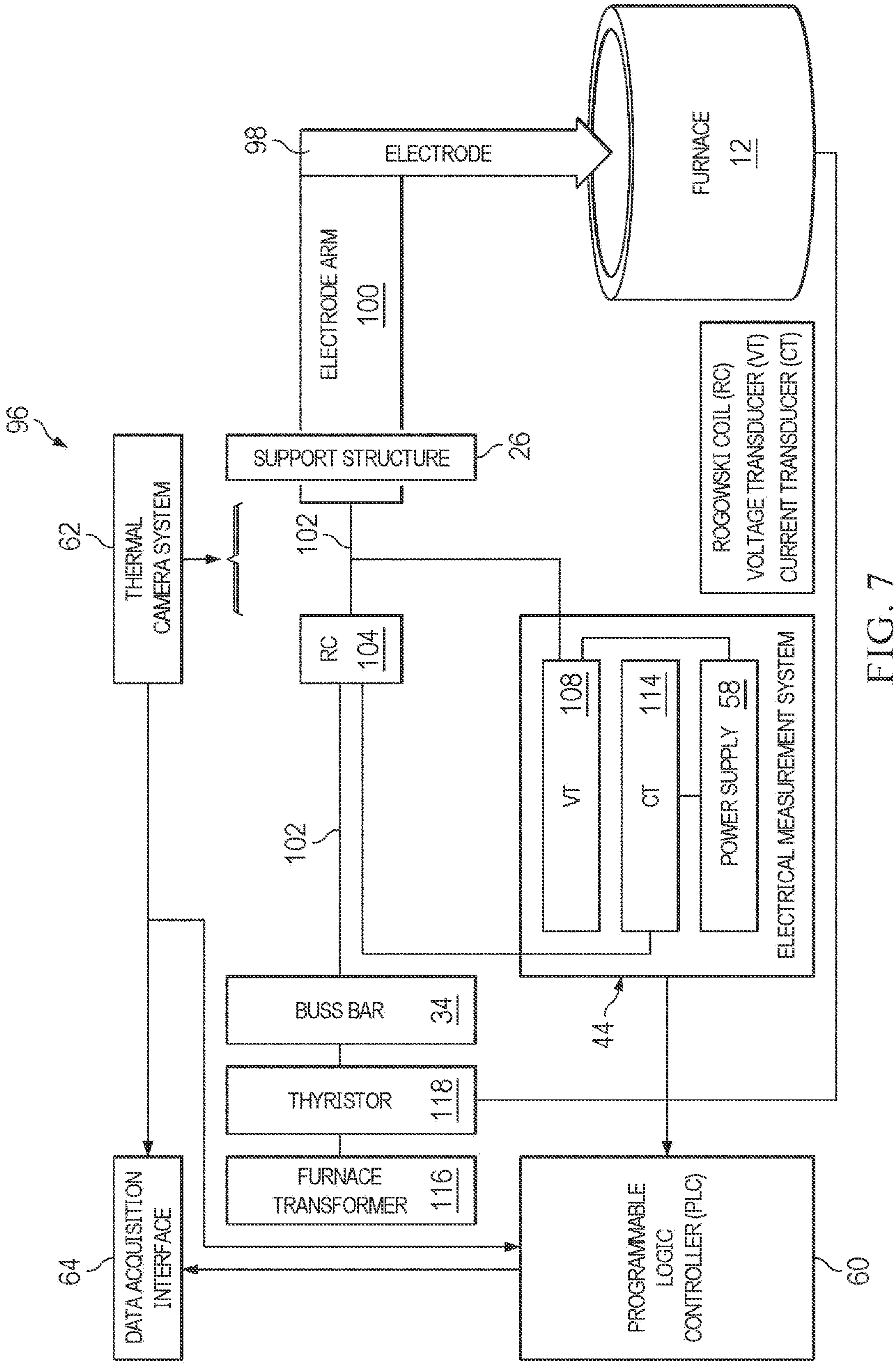
FIG. 7 is a schematic diagram of still yet another buss cable monitoring system, according to one or more embodiments.

Referring to FIG. 7, a buss cable monitoring system is generally referred to by reference numeral 96. The buss cable monitoring system 96 contains some of the components as shown in FIG. 1. Thus, reference numerals in FIG. 7 in common with reference numerals in FIG. 1 may share common reference numerals.

The system 96 includes the furnace 12 and an electrode 98 operably associated therewith. The electrode 98 is connected to an electrode arm 100. The support structure 26 supports the electrode arm 100.

A buss cable 102 extends from the electrode arm 100 to the buss bar 34. The buss cable 102 may be or include one or more water-cooled buss cables.

A Rogowski coil 104 extends around the buss cable 102. The Rogowski coil 104 is substantially identical to the Rogowski coil 36 and therefore will not be described in further detail.

The system 96 further includes a furnace transformer 116, which in several embodiments is a direct current transformer capable of handling an extreme load cycle and high current. The terms "extreme" and "high" are made in reference to common household electrical load cycles and currents. The values for "extreme" and "high" may be determined by the ordinary electrical engineer for a particular implementation.

The furnace transformer 116 is in electrical communication with a thyristor 118, which in turn is in electrical communication with the buss bar 34. In some embodiments, the thyristor 118 is part of a power switching circuit. In some embodiments, the thyristor 118 is an SCR rectifier or any other controlled rectifier.

In some embodiments, the furnace 12 includes a bottom electrode and/or anode pins, which are in electrical communication with the thyristor 118, thereby forming an anode portion. The electrical communication between the thyristor 118 and the buss cable 102, and ultimately the electrode 98, forms a cathode portion.

The Rogowski Coil 104 is in electrical communication with the electrical measurement system 44, which, as shown in FIG. 7, includes a voltage transducer 108, a current transducer 114, and a power supply 58. The power supply 58 supplies electrical power to the electrical measurement system 44. As an example, the power supply 58 may be a 24 volt direct current power supply. The thermal camera system 62 may be positioned proximate the buss cable 102.

In several embodiments, the operation of the system 96 is like the operation of the system 10, except that only one buss cable, e.g. the buss cable 102, is monitored for degradation and direct current rather than alternating-current is used to power system 96. For example, if the trending current decreases over time in buss cable 102, but the voltage remains constant, then the resistance value is increasing. This combination of measurements indicates that the buss cable 102 may be undergoing deterioration. Therefore, the buss cable 102 may be replaced, either presently or at some point in the future.

For another example, if the trending voltage increases over time in buss cables 102, but the current remains constant, then the resistance value is increasing. This combination of measurements indicates that the buss cable 102 is undergoing degradation and may be replaced, either presently or at some point in the future.

Figure 8:
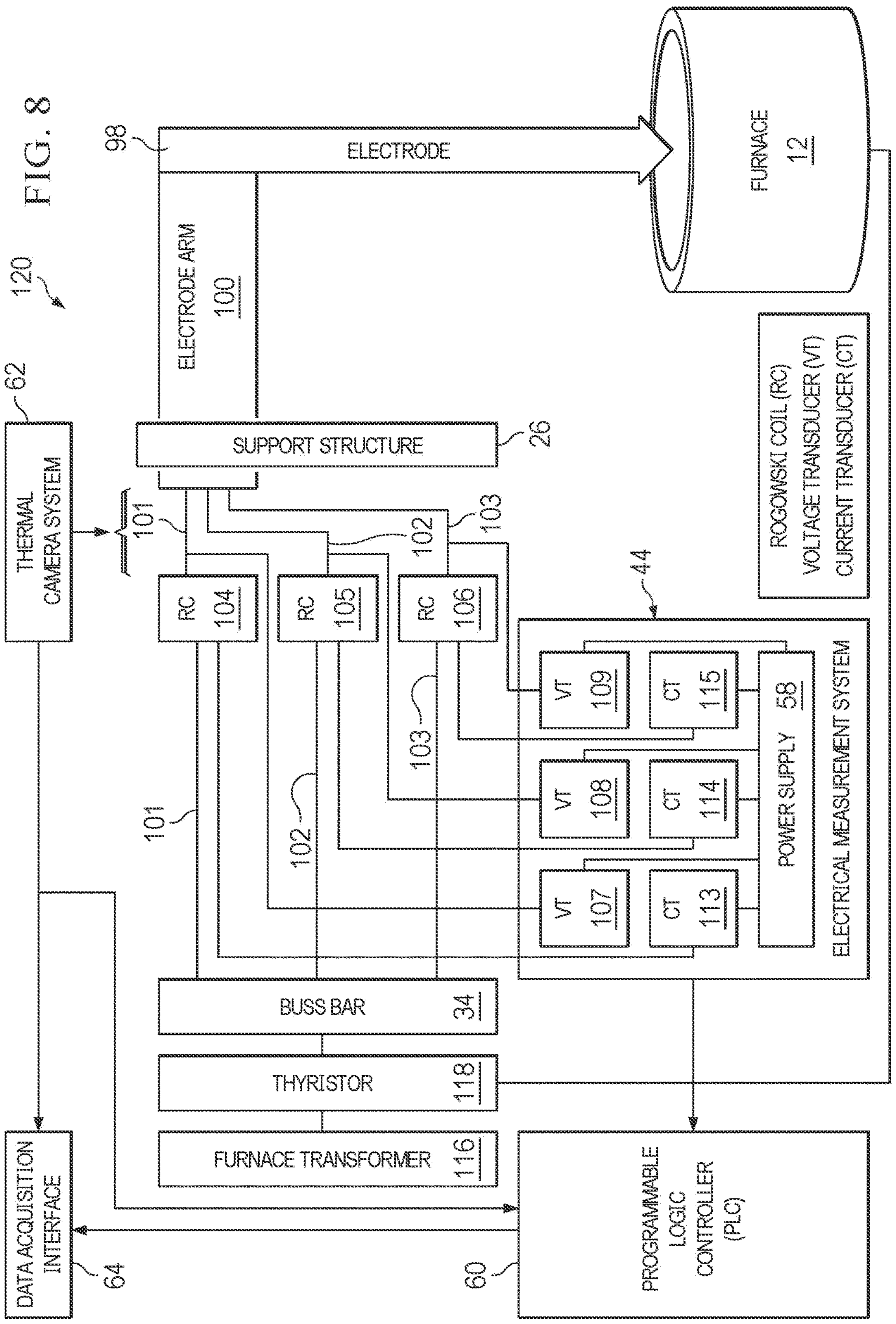
FIG. 8 is a schematic diagram of still yet another buss cable monitoring system, according to one or more embodiments.

Referring to FIG. 8, a buss cable monitoring system is generally referred to by reference numeral 120. The buss cable monitoring system 120 contains some of the components as shown in FIGS. 1 and 7, and these components are given the same reference numerals. In the system 120 of FIG. 8, buss cables 101, 102, and 103 are all connected to a singular electrode arm 100.

In some embodiments, each of the buss cables 101, 102, and 103 includes multiple buss cables. A Rogowski coil 104 extends around the buss cable 101 and is in electrical communication with a voltage transducer 107, which in turn is in electrical communication with a current transducer 113 of the electrical measurement system 44. A Rogowski coil 105 extends around the buss cable 102 and is in electrical communication with a voltage transducer 108. In turn, the voltage transducer 108 is in electrical communication with a current transducer 114 of the electrical measurement system 44. A Rogowski coil 106 extends around the buss cable 103 and is in electrical communication with a voltage transducer 109. In turn, the voltage transducer 108 is in electrical communication with a current transducer 115 of the electrical measurement system 44.

In some embodiments, the thermal camera system may include multiple thermal cameras to monitor buss cables 101, 102, and 103. In some embodiments, three thermal cameras are used to monitor buss cables 101, 102, and 103, respectively.

In several embodiments, the operation of the system 120 is like the operation of the system 10 of FIG. 1. However, in the system of FIG. 8, only one electrode arm, the electrode arm 100, operates to creates electric arcs and melt metals in the furnace 12.

Figure 9:
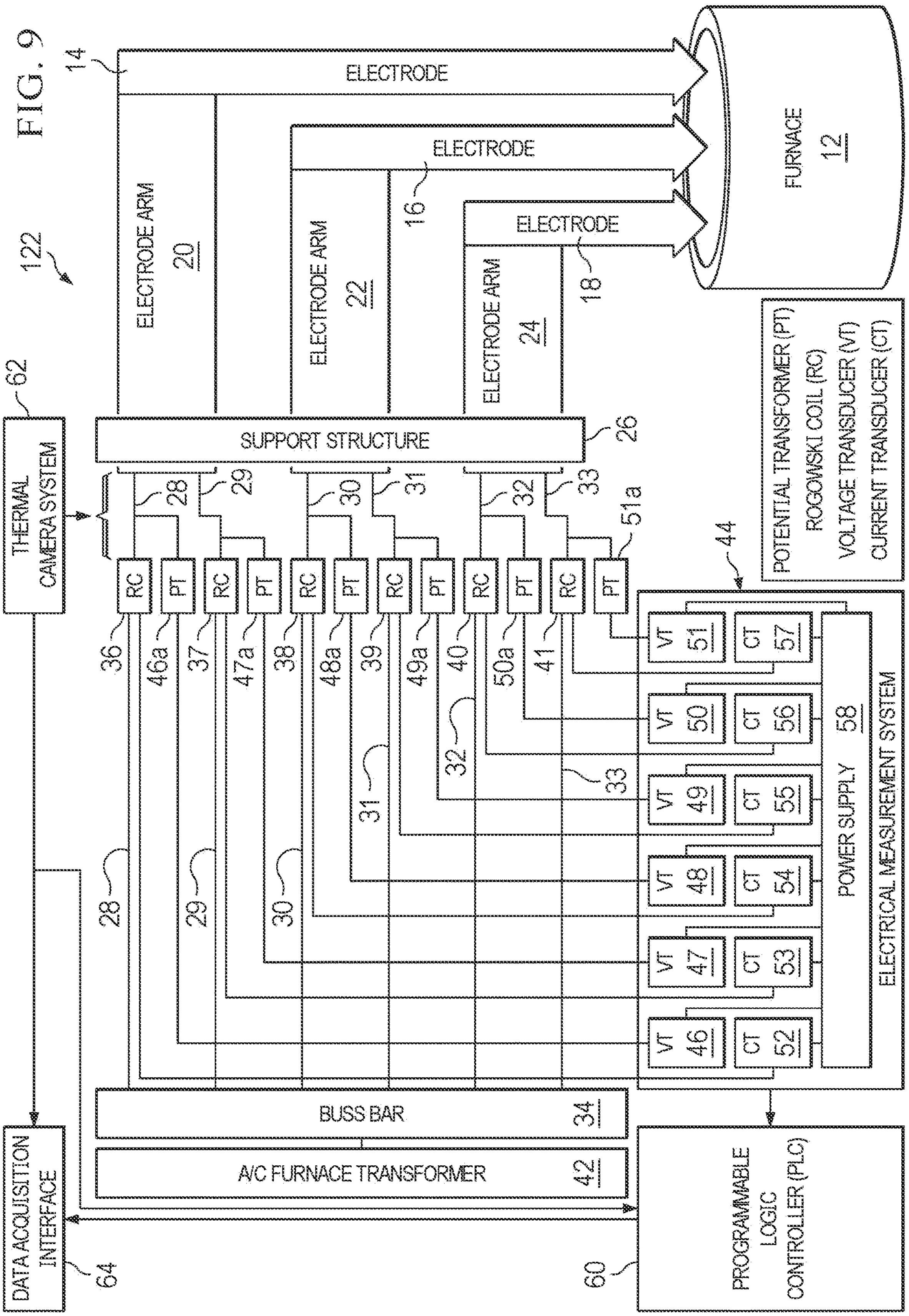
FIG. 9 is a schematic diagram of still yet another buss cable monitoring system, according to one or more embodiments.

Referring to FIG. 9, a buss cable monitoring system is generally referred to by reference numeral 122. The buss cable monitoring system of FIG. 9 contains some of the components as shown in previous figures. Thus, FIG. 9 shares common reference numerals with several figures, such as FIG. 1.

In the system 122 of FIG. 9, the buss cables 28, 30, and 32 extend from the electrode arms 20, 22, and 24, respectively. Additionally, buss cables 29, 31, and 33 also extend from the electrode arms 20, 22, and 24, respectively, and to the buss bar 34.

Furthermore, the Rogowski coils 36, 38, and 40 extend around the buss cables 28, 30, and 32, respectively. Additionally, Rogowski coils 37, 39, and 41 extend around the buss cables 29, 31, and 33, respectively.

The voltage transducers 46, 48, and 50 are in electrical communication with the potential transformers 46*a*, 48*a*, and 50*a*, respectively. Additionally, voltage transducers 47, 49, and 51 are in electrical communication with the potential transformers 47*a*, 49*a*, and 51*a*, respectively.

The current transducers 52, 54, and 56 are in electrical communication with the Rogowski coils 36, 38 and 40, respectively. Additionally, current transducers 53, 55, and 57 are in electrical communication with the Rogowski coils 37, 39, and 41, respectively.

The power supply 58 supplies electrical power to the voltage transducers 46, 47, 48, 49, 50, and 51. The power supply 58 also supplies electrical power to the current transducers 52, 53, 54, 55, 56, and 57.

In operation, the system 122 uses alternating current in parallel, rather than alternating current in series. In the example of FIG. 9 the system 122 has three phases for the alternating current but each phase is set up in parallel. Therefore, one phase is electrical power going to the electrode 14, from the electrode arm 20, and from the buss cable 28 in parallel with buss cable 29. Another phase is electrical power going to the electrode 16 from the electrode arm 22, and from the buss cable 30 in parallel with the buss cable 31. Still another phase is electrical power going to the electrode 18 from the electrode arm 24, and from the buss cable 32 in parallel with the buss cable 33.

Each of the three electrical phases is connected to a separate one of the electrodes 14, 16, and 18. Therefore, each phase has two Rogowski Coils, two current transducers, and two voltage transducers.

In some embodiments, each phase has two potential transformers. In some embodiments, a thermal camera is used per phase. In some embodiments, a thermal camera is used per buss cable 28, 29, 30, 31, 32, and 33. In some embodiments, when one buss cable in a phase is showing an increase in temperature, the other buss cable in the phase may be degrading.

Figure 10:
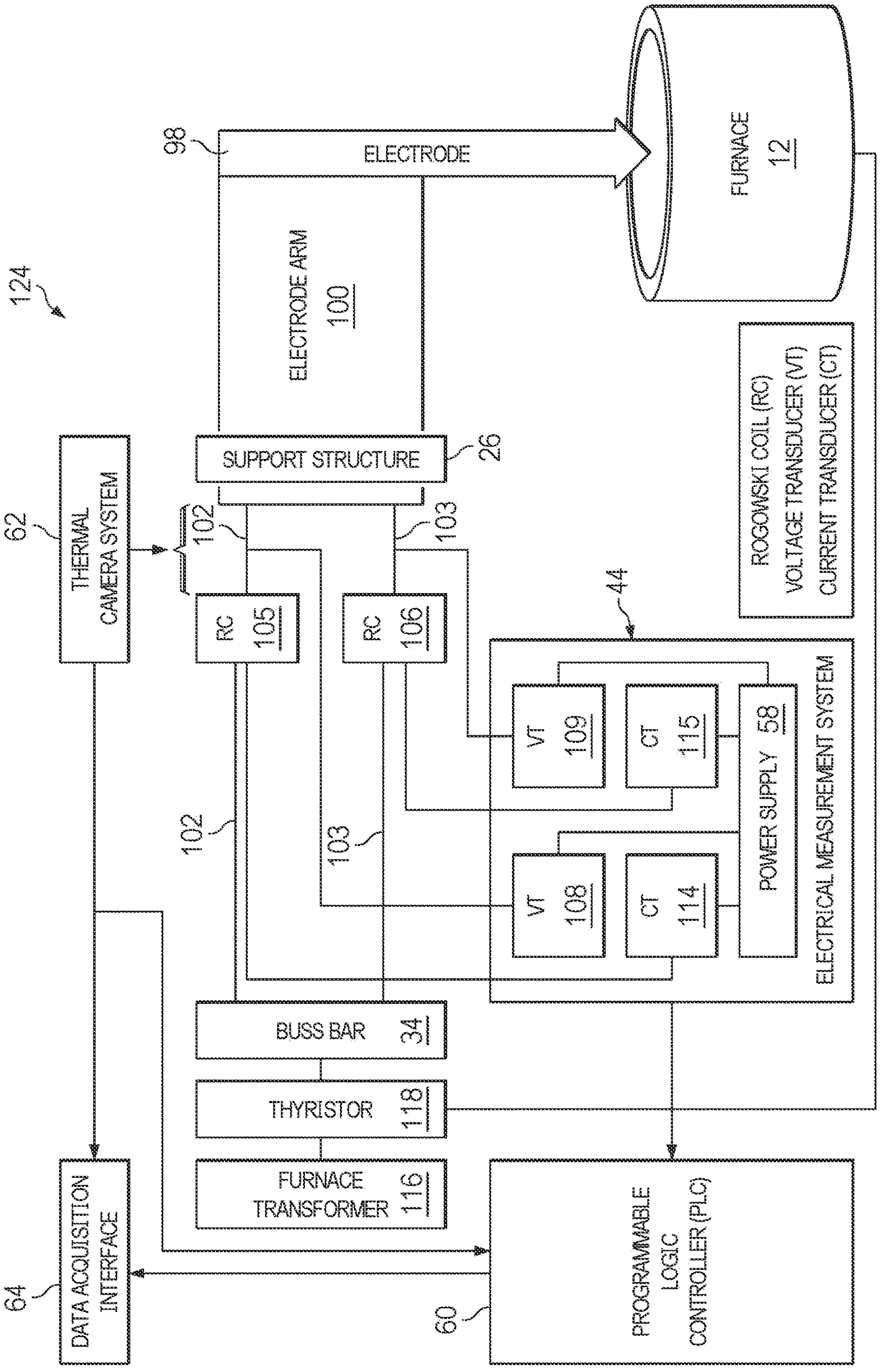
FIG. 10 is a schematic diagram of still yet another buss cable monitoring system, according to one or more embodiments.

Referring to FIG. 10, a buss cable monitoring system is generally referred to by reference numeral 124. FIG. 10 contains some of the components as shown in FIG. 8. Thus, FIG. 10 and FIG. 8 share common reference numerals referring to similar components. The system 124 is like the system 120 of FIG. 8, but the buss cable 101, the Rogowski coil 104, the voltage transducer 107, and the current transducer 113 are omitted.

During operation, the system 128 uses parallel, direct current, rather than direct current in series. The buss cables 102 and 103 are connected in parallel.

In some embodiments, a thermal camera is used per buss cable 102 and 103. In some embodiments, one thermal camera is used in the thermal camera system 62.

FIGS. 9 and 10 may be used, during the operation of each of the system 122 and 124, for parallel buss cable operations. In this case, the PLC 60 and/or the data acquisition interface 64 may determine whether the trending current increases in one buss cable and decreases in the other. If so, then the buss cable carrying less current is likely undergoing degradation. Therefore, the PLC 60 and/or the data acquisition interface 64 may determine that there is an internal conductor failure as the difference between respective electrical measurements of the two buss cables increases. The failure may be reported, possibly prompting technicians to change the buss cable or cables.

Figure 11:
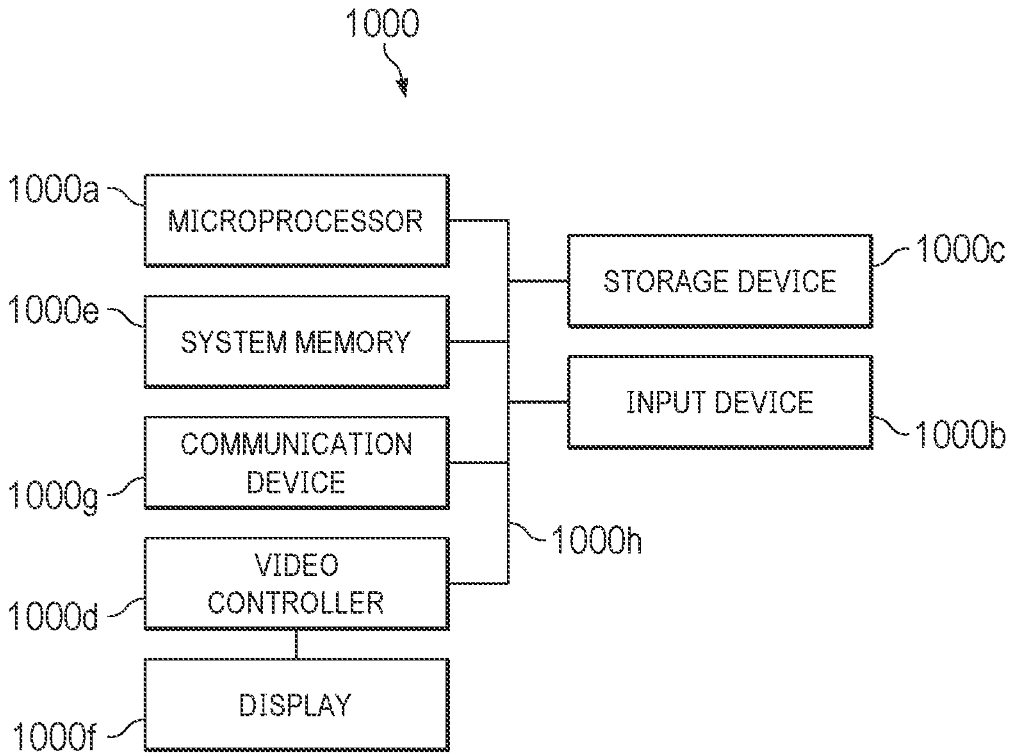
FIG. 11 is a diagrammatic illustration of a computing node for implementing one or more embodiments of the present disclosure.

Referring to FIG. 11, with continuing reference to FIGS. 1-10, an illustrative node 1000 is depicted. The node 1000 may be used for implementing one or more of the embodiments of one or more of the controller(s), such as the PLC 60 and/or the data acquisition interface 64. The node 1000 also may be used for implementing other element(s) or apparatus describe above. The node 1000 also may be used to implement the system(s) described herein, such as e.g., the system 10, the system 72, the system 80, the system 96, the system 120, the system 122, the system 124, or any combination thereof. The node 1000 also may be used to implement one or more methods described herein, including (e.g., method 300, method 500, or both, as well as steps or sub-steps of those methods.

The node 1000 includes a number of components. The components include a microprocessor 1000*a*, an input device 1000*b*, a storage device 1000*c*, a video controller 1000*d*, a system memory 1000*e*, a display 1000*f*, and a communication device 1000*g*. The components may be interconnected by one or more buses 1000*h*.

In one or more embodiments, the storage device 1000*c* may include a hard drive, CD-ROM, optical drive, another form of storage device, and combinations thereof. In one or more embodiments, the storage device 1000*c* may include, and/or be capable of receiving, a CD-ROM, DVD-ROM, or another form of non-transitory computer-readable medium that may contain executable instructions.

In one or more embodiments, the communication device 1000*g* may include a modem, network card, or another device to enable the node 1000 to communicate with other node(s). In one or more embodiments, the node and the other node(s) represent one or more interconnected computer systems, including without limitation, personal computers, mainframes, PDAs, smartphones and cell phones. The one or more computers may be interconnected via the Internet or an intranet.

One or more of the embodiments described with respect to FIGS. 1-10 may include at least the node 1000 and/or components thereof. The one or more embodiments also may include one or more nodes that are substantially like the node 1000 and/or components thereof. The one or more embodiments may include respective pluralities of similar components as the node 1000.

The one or more embodiments may include a computer program that includes instructions, data, and/or combinations thereof. The one or more embodiments may include an application written in, for example, Arena, HyperText Markup Language (HTML), Cascading Style Sheets (CSS), JavaScript, Extensible Markup Language (XML), asynchronous JavaScript and XML (Ajax), Python, and/or combinations thereof. The one or more embodiments contemplate that a web-based application may be written in, for example, Java or Adobe Flex. Such a web-based application may pull real-time information from one or more servers, automatically refreshing with latest information at predetermined time increments, or combinations thereof.

In one or more embodiments, a computer system includes at least hardware capable of executing machine readable instructions, as well as the software for executing acts (typically machine-readable instructions) that produce a desired result. In one or more embodiments, a computer system may include hybrids of hardware and software, as well as computer sub-systems.

In one or more embodiments, hardware generally includes at least processor-capable platforms, such as client-machines (also known as personal computers or servers), and hand-held processing devices (such as smart phones, tablet computers, or personal computing devices (PCDs), for example). In one or more embodiments, hardware may include a physical device that is capable of storing machine-readable instructions. Such a physical device may include hardware memory or other data storage devices. In one or more embodiments, other forms of hardware include hardware sub-systems, including transfer devices such as modems, modem cards, ports, and port cards, for example.

In one or more embodiments, software includes machine code stored in a memory medium, such as RAM or ROM, and machine code stored on other devices (such as floppy disks, flash memory, or a CD-ROM, for example). In one or more embodiments, software may include source or object code. In one or more embodiments, software encompasses a set of instructions capable of being executed on a node such as, for example, on a client machine or server.

In one or more embodiments, combinations of software and hardware could also be used for providing enhanced functionality and performance for certain embodiments of the present disclosure. In an embodiment, software functions may be directly manufactured into a silicon chip. Accordingly, combinations of hardware and software are also included within the definition of a computer system and are thus envisioned by the present disclosure as possible equivalent structures and equivalent methods.

In one or more embodiments, computer readable mediums include, for example, passive data storage, such as a random-access memory (RAM). Computer readable mediums also include a semi-permanent data storage, such as a compact disk read only memory (CD-ROM). One or more embodiments of the present disclosure may be embodied in the RAM of a computer to transform a standard computer into a new specific computing machine. In one or more embodiments, data structures are defined organizations of data that may enable an embodiment of the present disclosure. In an embodiment, a data structure may provide an organization of data, or an organization of executable code.

In one or more embodiments, networks and/or one or more portions thereof may be designed to work on any specific architecture. In an embodiment, one or more portions of any networks may be executed on a single computer, local area networks, client-server networks, wide area networks, internets, hand-held and other portable and wireless devices and networks.

In one or more embodiments, a database may be any standard or proprietary database software. In one or more embodiments, the database may have fields, records, data, and other database elements that may be associated through database specific software.

In one or more embodiments, data may be mapped. In one or more embodiments, mapping is the process of associating one data entry with another data entry. In an embodiment, the data contained in the location of a character file can be mapped to a field in a second table. In one or more embodiments, the physical location of the database is not limiting, and the database may be distributed. In an embodiment, the database may exist remotely from the server, and run on a separate platform. In an embodiment, the database may be accessible across the Internet. In one or more embodiments, more than one database may be implemented.

In one or more embodiments, multiple instructions may be stored on a non-transitory computer readable medium. The instructions may be executed by one or more processors to implement in whole or in part one or more of the embodiments described herein. For example, the one or more embodiments may execute instructions to carry out the functions of one or more of the controller(s) e.g., element(s), apparatus, system(s) e.g., method(s) e.g., step(s), and/or sub-step(s), as described above.

In one or more embodiments, such a processor may include one or more of the microprocessor **1000*a* or processor(s) that are part of the components of the above-described systems. For example, the processor(s) may be included with or programmed to execute the functions of the PLC 60, the data acquisition interface 64**, and/or any combination thereof. Such a computer readable medium may be distributed among one or more components of the system.

In one or more embodiments, such a processor may execute the instructions in connection with a virtual computer system. In one or more embodiments, such instructions may communicate directly with the one or more processors, and/or ay interact with one or more operating systems, middleware, firmware, other applications, and/or any combination thereof, to cause the one or more processors to execute the instructions.

A first method has been disclosed. The first method generally includes: melting metal in a furnace, including: supplying electrical power to one or more electrodes to create arc(s) to melt the metal in the furnace; wherein the electrical power is supplied to the one or more electrodes via one or more buss cables; measuring temperature(s) of the one or more buss cables; and determining, using the measured temperature(s) of the one or more buss cables, the degree(s) to which the one or more buss cables have degraded. In one or more embodiments, the temperature(s) of the one or more buss cables are measured using a thermal camera positioned proximate the one or more buss cables. In one or more embodiments, one or more temperature sensors are operably associated with the one or more buss cables; wherein the temperature(s) of the one or more buss cables are measured using the one or more temperature sensors. In one or more embodiments, each of the one or more buss cables has opposing first and second end portions; wherein the one or more temperature sensors include a first temperature sensor positioned at the first end portion of one of the one or more buss cables. In one or more embodiments, the one or more temperature sensors include a second temperature sensor positioned at the second end portion of the one of the one or more buss cables. In one or more embodiments, the one or more temperature sensors are in communication with a controller and/or a data acquisition interface; wherein the degree(s) to which the one or more buss cables have degraded is/are determined using the controller and/or the data acquisition interface. In one or more embodiments, the thermal camera is in communication with a controller and/or a data acquisition interface; wherein the degree(s) to which the one or more buss cables have degraded is/are determined using the controller and/or the data acquisition interface. In one or more embodiments, measuring temperature(s) of the one or more buss cables includes: measuring first temperature(s) of the one or more buss cables over a first time period; and measuring second temperature(s) of the or more buss cables over a second time period; wherein determining, using the measured temperature(s) of the one or more buss cables, the degree(s) to which the one or more buss cables have degraded includes: comparing the second temperature(s) with the first temperature(s). In one or more embodiments, the method further includes: measuring voltage and/or current of each of the one or more buss cables; wherein the degree(s) to which the one or more buss cables have degraded are determined using the measured temperature(s) and the measured voltage and/or current.

A first system has also been disclosed. The first system generally includes: a furnace; a first electrode operably associated with the furnace; a buss cable in electrical communication with the first electrode; and a controller adapted to receive data and/or signals associated with the buss cable; wherein the system further includes: (i) a temperature measurement system adapted to measure temperature(s) of the buss cable; (ii) an electrical measurement system adapted to measure voltage and/or current of the buss cable; or both (i) and (ii). In one or more embodiments, the system includes (i). In one or more embodiments, the temperature measurement system includes: a thermal camera, one or more temperature sensors; or both the thermal camera and the one or more temperature sensors. In one or more embodiments, the system includes (ii). In one or more embodiments, the electrical measurement system includes a Rogowski coil extending around the buss cable. In one or more embodiments, the system includes both (i) and (ii).

A second method has also been disclosed. The second method generally includes: melting metal in a furnace, including: supplying electrical power to one or more electrodes to create arc(s) to melt the metal in the furnace; wherein the electrical power is supplied to the one or more electrodes via one or more buss cables; measuring voltage and/or current of each of the one or more buss cables; determining, using the measured voltage and/or current of each of the one or more buss cables, the degree(s) to which the one or more buss cables have degraded. In some embodiments, measuring voltage and/or current of each of the one or more buss cables includes: measuring, using one or more Rogowski coils, current of each of the one or more buss cables, wherein each of the one or more Rogowski coils extends around a respective one of the one or more buss cables; and measuring, using one or more potential transformers, voltage of each of the one or more buss cables. In some embodiments, the one or more Rogowski coils generate current data and/or signals; the one or more potential transformers generate voltage data and/or signals; the voltage of each of the one or more buss cables is measured using the voltage data and/or signals generated by the one or more potential transformers; and the current of each of the one or more buss cables is measured using the current data and/or signals generated by the one or more Rogowski coils. In one or more embodiments, the method further includes: measuring temperature(s) of the one or more buss cables; wherein the measured temperature(s) are used to confirm the degree(s) to which the one or more buss cables have degraded. In one or more embodiments, the degree(s) to which the one or more buss cables have degraded is/are determined using a controller and/or a data acquisition interface.

It is understood that variations may be made in the foregoing without departing from the scope of the present disclosure. For example, the elements and teachings of the various embodiments may be combined in whole or in part. In addition, one or more of the elements and teachings of the various embodiments may be omitted, at least in part, and/or combined, at least in part, with one or more of the other elements and teachings of the various embodiments.

Any spatial references, such as, for example, "upper," "lower," "above," "below," "between," "bottom," "vertical," "horizontal," "angular," "upwards," "downwards," "side-to-side," "left-to-right," "right-to-left," "top-to-bottom," "bottom-to-top," "top," "bottom," "bottom-up," "top-down," etc., are for the purpose of illustration only. Such spatial references do not limit the specific orientation or location of the structure described above.

In several embodiments, while different steps, processes, and procedures are described as appearing as distinct acts, one or more of the steps, one or more of the processes, and/or one or more of the procedures may also be performed in different orders, simultaneously and/or sequentially. In several embodiments, the steps, processes, and/or procedures may be merged into one or more steps, processes and/or procedures.

In several embodiments, one or more of the operational steps in each embodiment may be omitted. Moreover, in some instances, some features of the present disclosure may be employed without a corresponding use of the other features. Moreover, one or more of the above-described embodiments and/or variations may be combined in whole or in part with any one or more of the other above-described embodiments and/or variations.

Although several embodiments have been described in detail above, the embodiments described are illustrative only and are not limiting. Those skilled in the art will readily appreciate that many other modifications, changes and/or substitutions are possible in the embodiments without materially departing from the novel teachings and advantages of the present disclosure. Accordingly, all such modifications, changes, and/or substitutions are intended to be included within the scope of this disclosure as defined in the following claims. In the claims, any means-plus-function clauses are intended to cover the structures described herein as performing the recited function and not only structural equivalents, but also equivalent structures. Moreover, it is the express intention of the applicant not to invoke 35 U.S.C. § 112(f) for any limitations of any of the claims herein, except for those in which the claim expressly uses the word "means" together with an associated function.

The term "about," when used with respect to a physical property that may be measured, refers to an engineering tolerance anticipated or determined by an engineer or manufacturing technician of ordinary skill in the art. The exact quantified degree of an engineering tolerance depends on the product being produced and the technical property being measured. For example, two angles may be "about congruent" if the values of the two angles are within a first predetermined range of angles for one embodiment, but also may be "about congruent" if the values of the two angles are within a second predetermined range of angles for another embodiment. The ordinary artisan is capable of assessing what is an acceptable engineering tolerance for a particular product, and thus is capable of assessing how to determine the variance of measurement contemplated by the term "about."

As used herein, the term "connected to" contemplates at least two meanings, unless stated otherwise. In a first meaning, "connected to" means that component A was, at least at some point, separate from component B, but then was later joined to component B in either a fixed or a removably attached arrangement. In a second meaning, "connected to" means that component A could have been integrally formed with component B. Thus, for example, a bottom of a pan is "connected to" a wall of the pan. The term "connected to" may be interpreted as the bottom and the wall being separate components that are snapped together, welded, or are otherwise fixedly or removably attached to each other. However, the bottom and the wall may be deemed "connected" when formed contiguously together as a monocoque body.

In the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

Further, unless expressly stated otherwise, or is an inclusive "or" and, as such includes "and." Further, items joined by an or may include any combination of the items with any number of each item unless expressly stated otherwise.

In the above description, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description. Further, other embodiments not explicitly described above can be devised which do not depart from the scope of the invention as disclosed herein. Accordingly, the scope of the invention should be limited only by the attached claims.

What is claimed is:

1. A system, comprising:

an electrode;

a plurality of buss cables in electrical communication with the electrode, wherein the plurality of buss cables are arranged into a plurality of phases;

a temperature measurement system adapted to measure a plurality of temperatures of the plurality of buss cables, wherein the temperature measurement system comprises a plurality of thermal cameras and/or a plurality of temperature sensors assigned to each phase of the plurality of phases and wherein a temperature is produced by electrical power flowing from a buss cable to the electrode to create an arc to melt metal; and a controller programmed to:

determine a baseline threshold temperature range for each phase of the plurality of phases from measured data of the plurality of buss cables over a predetermined period of time, receive the plurality of temperatures, compare the plurality of temperatures of the plurality of buss cables against the baseline temperature threshold temperature range for each phase, and determine a degree to which each of the plurality of buss cables has degraded, wherein the determining further comprises identifying whether each of the plurality of buss cables is out of the corresponding baseline temperature threshold range.

2. The system of claim 1, further comprising:

an electrical measurement system adapted to measure at least one of a voltage and a current of a buss cable of the plurality of buss cables; and wherein the controller is programmed to further use the at least one of the voltage and the current of a buss cable of the plurality of buss cables to determine the degree of degradation of the buss cable.

3. The system of claim 2, wherein the electrical measurement system comprises a Rogowski coil extending around a buss cable of the plurality of buss cables.

4. The system of claim 1, further comprising:

a furnace in communication with the electrode, wherein electricity passed through the electrode causes the furnace to heat; and a switch programmed to switch off the furnace responsive to the degree of degradation exceeding a threshold.

5. The system of claim 1, wherein the controller is further programmed to determine the degree of degradation by measuring the temperature of a buss cable over a time period and to report the degree of degradation as exceeding a threshold degree when the temperature of the buss cable varies by more than a predetermined temperature difference over the time period.

* * * * *